US012402339B2

United States Patent
Kang et al.

(10) Patent No.: US 12,402,339 B2
(45) Date of Patent: Aug. 26, 2025

(54) POWER SEMICONDUCTOR DEVICE, POWER SEMICONDUCTOR CHIP INCLUDING THE SAME, AND METHOD FOR MANUFACTURING THE SAME

(71) Applicant: HYUNDAI MOBIS CO., LTD., Seoul (KR)

(72) Inventors: Min Gi Kang, Yongin-si (KR); Hyuk Woo, Yongin-si (KR); Tae Young Park, Yongin-si (KR); Ju Hwan Lee, Yongin-si (KR); Seon Hyeong Jo, Yongin-si (KR); Seong Hwan Yun, Yongin-si (KR); Tae Yang Kim, Yongin-si (KR)

(73) Assignee: Hyundai Mobis Co., Ltd., Seoul (KR)

( * ) Notice: Subject to any disclaimer, the term of this patent is extended or adjusted under 35 U.S.C. 154(b) by 456 days.

(21) Appl. No.: 18/089,234

(22) Filed: Dec. 27, 2022

(65) Prior Publication Data
US 2023/0343860 A1    Oct. 26, 2023

(30) Foreign Application Priority Data

Apr. 25, 2022 (KR) .................. 10-2022-0050744

(51) Int. Cl.
*H10D 12/00* (2025.01)
*H10D 12/01* (2025.01)
(Continued)

(52) U.S. Cl.
CPC ......... *H10D 12/481* (2025.01); *H10D 12/038* (2025.01); *H10D 62/106* (2025.01); *H10D 62/133* (2025.01); *H10D 64/117* (2025.01)

(58) Field of Classification Search
CPC .. H10D 12/481; H10D 12/038; H10D 62/106; H10D 62/133; H10D 64/117
(Continued)

(56) References Cited

U.S. PATENT DOCUMENTS

| 2013/0037853 | A1* | 2/2013 | Onozawa | H10D 64/231 |
| | | | | 257/E29.198 |
| 2014/0077265 | A1* | 3/2014 | Simin | H01L 23/66 |
| | | | | 257/192 |

(Continued)

FOREIGN PATENT DOCUMENTS

KR    10-2014-0057630 A    5/2014

*Primary Examiner* — Igwe U Anya
(74) *Attorney, Agent, or Firm* — NSIP Law

(57) ABSTRACT

A power semiconductor device includes a plurality of gate electrodes configured to be recessed from a first surface of a semiconductor substrate to a second surface of the semiconductor substrate, the second surface being opposite to the first surface, an emitter region configured to make contact with a trench and the first surface, being provided between respective ones of the plurality of gate electrodes, and including impurities of a first conductive type, a collector region configured to make contact with the second surface, and including second impurities of a second conductive type opposite to the first conductive type, a floating region extending toward the second surface in an extension direction of the trench while surrounding a bottom surface of the trench, and including the second impurities, and a trench emitter region interposed between the plurality of gate electrodes in the trench.

16 Claims, 23 Drawing Sheets

(51) Int. Cl.
*H10D 62/10* (2025.01)
*H10D 62/13* (2025.01)
*H10D 64/00* (2025.01)

(58) Field of Classification Search
USPC .......................................................... 257/139
See application file for complete search history.

(56) References Cited

U.S. PATENT DOCUMENTS

2015/0380538 A1* 12/2015 Ogawa ................. H10D 64/117
257/144
2020/0212209 A1* 7/2020 Nagata ................. H10D 12/038
2022/0320322 A1* 10/2022 Ngwendson ......... H10D 64/232

* cited by examiner

POWER SEMICONDUCTOR DEVICE, POWER SEMICONDUCTOR CHIP INCLUDING THE SAME, AND METHOD FOR MANUFACTURING THE SAME

CROSS-REFERENCE TO RELATED APPLICATION

This application claims the benefit under 35 USC § 119(a) of Korean Patent Application No. 10-2022-0050744, filed in the Korean Intellectual Property Office on Apr. 25, 2022, the entire contents of which are incorporated herein by reference for all purposes.

BACKGROUND

1. Field

The present disclosure relates to a power semiconductor device, capable of performing a switching operation, a power semiconductor chip including the same, and a method for manufacturing the same.

2. Description of the Related Art

A power semiconductor device may refer to a semiconductor device capable of performing a switching operation under a higher voltage and higher current environment. The power semiconductor device has been mainly used in a field (e.g., an inverter device) requiring higher power switching (that is, a switching operation under the higher voltage and higher current environment). The power semiconductor device may include, for example, an insulated gate bipolar transistor (IGBT) or a power MOSFET. Such a power semiconductor device basically requires a withstand voltage characteristic for a higher voltage. Recently, a higher-speed switching operation has been additionally required.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, here is provided a power semiconductor device including a plurality of gate electrodes configured to be recessed from a first surface of a semiconductor substrate to a second surface of the semiconductor substrate, the second surface being opposite to the first surface, an emitter region configured to make contact with a trench and the first surface, wherein the emitter region is provided between respective ones of the plurality of gate electrodes, wherein the emitter region includes first impurities of a first conductive type, a collector region configured to make contact with the second surface, and including second impurities of a second conductive type opposite to the first conductive type, a floating region extending toward the second surface in an extension direction of the trench while surrounding a bottom surface of the trench, and including the second impurities, and a trench emitter region interposed between the plurality of gate electrodes in the trench.

The power semiconductor device may also include a gate insulating film, the gate insulating film being interposed between a side surface of the trench and the plurality of gate electrodes, the gate insulating film having a first thickness that is less than a second thickness of a gate insulating film interposed between the bottom surface of the trench and the plurality of gate electrodes.

A first length of the trench emitter region extending from the first surface of the semiconductor substrate may be longer than a second length of each of the plurality of gate electrodes extending from the first surface.

The trench emitter region may be electrically connected to the emitter region through an emitter electrode.

The trench emitter region may include polysilicon.

A third length of the floating region in the extension direction may be greater than a first width of the floating region.

A first width of the floating region may be greater than a second width of the trench.

A first depth from the first surface to an upper end of the floating region may be shallower than a second depth from the first surface to a lower end of the trench.

A lower end of the floating region may be spaced apart from an upper end of the collector region by a specific distance.

The emitter region may include a plurality of regions disposed at opposite sides of the trench, respectively.

The power semiconductor device may also include a drift region disposed on the collector region, the drift region extending in the extension direction while making contact with a side surface of each of the floating region and the trench and the drift region may include the first impurities.

A first doping concentration of the first impurities in the emitter region may be heavier than a second doping concentration of the first impurities in the drift region.

The plurality of gate electrodes may be disposed in a stripe type or a ring type, when viewed from a plan view.

In another general aspect, here is provided a power semiconductor chip that includes a cell region including the power semiconductor device and a peripheral region including a gate terminal, an emitter terminal, and a collector terminal electrically connected to the plurality of gate electrodes, the emitter region, and the collector region, respectively.

In yet another general aspect, here is provided a method for manufacturing a power semiconductor device, the method including forming a first drift region including first impurities of a first conductive type, through epitaxial growth, forming a floating region by implanting second impurities including a second conductive type opposite to the first conductive type, into an upper portion of the first drift region, forming a second drift region including the first impurities on the first drift region through the epitaxial growth, forming an emitter region by implanting the first impurities into an upper portion of the second drift region, forming a trench through the emitter region by performing an etching process to etch at least a portion of the floating region, forming a plurality of gate electrodes by depositing a conductive material to be spaced apart from a surface of the trench, and forming a trench emitter region by depositing a conductive material between the plurality of gate electrodes such that the trench emitter region is spaced apart from each of the plurality of gate electrodes.

Figure 1:
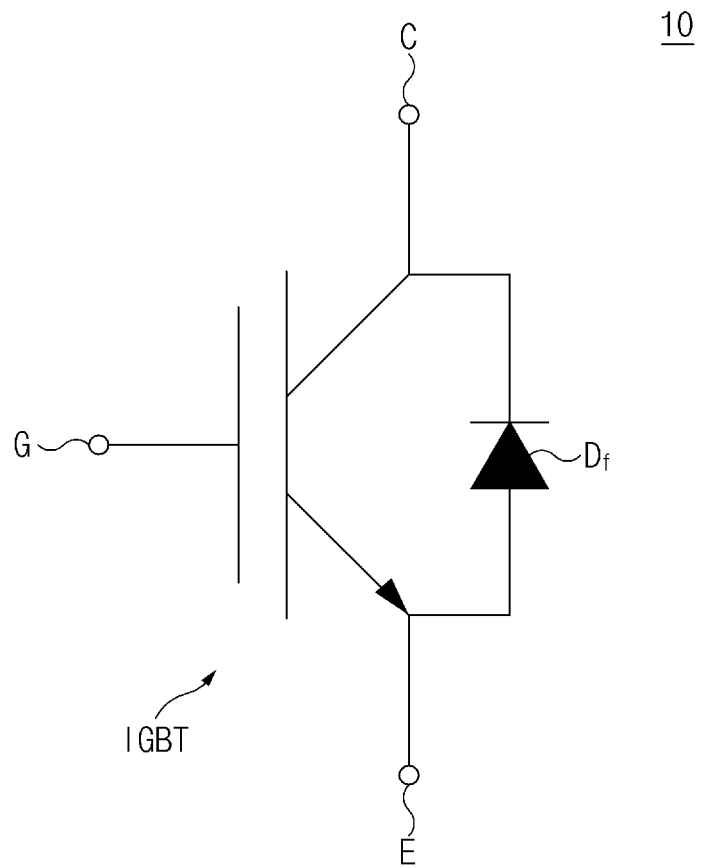
FIG. 1 is a view illustrating a power semiconductor device, according to an embodiment of the present disclosure.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Advantages and features of the present disclosure and methods of achieving the advantages and features will be clear with reference to embodiments described in detail below together with the accompanying drawings. However, the present disclosure is not limited to the embodiments disclosed herein but will be implemented in various forms. The embodiments of the present disclosure are provided so that the present disclosure is completely disclosed, and a person with ordinary skill in the art can fully understand the scope of the present disclosure. The present disclosure will be defined only by the scope of the appended claims. Meanwhile, the terms used in the present specification are for explaining the embodiments, not for limiting the present disclosure.

Terms, such as first, second, A, B, (a), (b) or the like, may be used herein to describe components. Each of these terminologies is not used to define an essence, order or sequence of a corresponding component but used merely to distinguish the corresponding component from other component(s). For example, a first component may be referred to as a second component, and similarly the second component may also be referred to as the first component.

Throughout the specification, when a component is described as being "connected to," or "coupled to" another component, it may be directly "connected to," or "coupled to" the other component, or there may be one or more other components intervening therebetween. In contrast, when an element is described as being "directly connected to," or "directly coupled to" another element, there can be no other elements intervening therebetween.

In a description of the embodiment, in a case in which any one element is described as being formed on or under another element, such a description includes both a case in which the two elements are formed in direct contact with each other and a case in which the two elements are in indirect contact with each other with one or more other elements interposed between the two elements. In addition, when one element is described as being formed on or under another element, such a description may include a case in which the one element is formed at an upper side or a lower side with respect to another element.

The singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof.

FIG. 1 is a view illustrating a power semiconductor device, according to an embodiment of the present disclosure.

Referring to FIG. 1, a power semiconductor device 10 according to an embodiment of the present disclosure, which is a device operated by a switch under a higher voltage and a higher current, may be employed for an inverter.

As illustrated in FIG. 1, the power semiconductor device 10 may include an insulated gate bipolar transistor (IGBT). According to another embodiment, although the power semiconductor device 10 may be realized in another type of power transistor (e.g., a metal oxide semiconductor field effect transistor (MOSFET) based on a silicon carbide). The technical spirit of the present disclosure will be described on the assumption that the power semiconductor device 10 is realized.

The IGBT may have a structure in which a gate of MOSFET is coupled to an emitter and a collector of a bipolar transistor. Accordingly, the power semiconductor device 10 may have both the withstand voltage characteristic of the bipolar transistor and the more rapid switching speed of the MOSFET.

The IGBT may be a self-quenching device in which the gate-emitter voltage Vge is changed to be turned on or off depending on the driving voltage applied to the gate. In this case, the self-quenching type device is a device to receive an input signal without depending on the outside, thereby allowing a current to flow between two terminals (that is, an emitter and a collector) or preventing the current from flowing between the two terminals through self-control ability.

The IGBT may include a gate terminal G connected to a gate, an emitter terminal E connected to the emitter, and a collector terminal C connected to the collector. The IGBT is turned on or off in response to a driving voltage applied to the gate terminal G, thereby allowing the current to flow between two terminals (that is, an emitter and a collector) or preventing the current from flowing between the two terminals. The gate terminal G may be connected a driver circuit (not illustrated) to transfer the driving voltage, and the emitter terminal E and the collector terminal C may be connected to a load (not illustrated) to provide a switching function.

According to an embodiment, the power semiconductor device 10 may further include a flyback diode Df connected between the emitter terminal E and the collector terminal C. The flyback diode Df may provide a loop that allows carriers (holes or electrons), which are accumulated in the emitter or collector due to the on-operation of the IGBT, to be re-emitted in the off-operation of the IGBT. The flyback diode Df may prevent an impulse voltage by providing such a loop, thereby preventing the damage to a load connected to the IGBT or the power semiconductor device 10.

Figure 2:
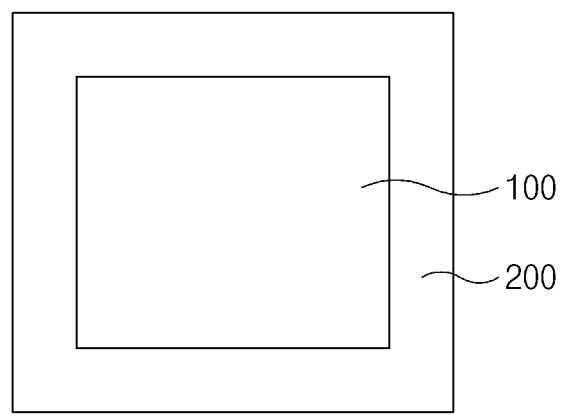
FIG. 2 is a view schematically illustrating a power semiconductor chip including the power semiconductor device of FIG. 1.

FIG. 2 is a view schematically illustrating a power semiconductor chip including the power semiconductor device of FIG. 1.

Referring to FIG. 2, a power semiconductor chip 20 may be a semiconductor chip including the power semiconductor device 10 of FIG. 1. The power semiconductor chip 20 may include one power semiconductor device 10 formed in an integral type, or may include a plurality of power semiconductor devices 10 according to another embodiment.

The power semiconductor chip 20 may include a cell region 100 and a peripheral region 200.

Figure 3:
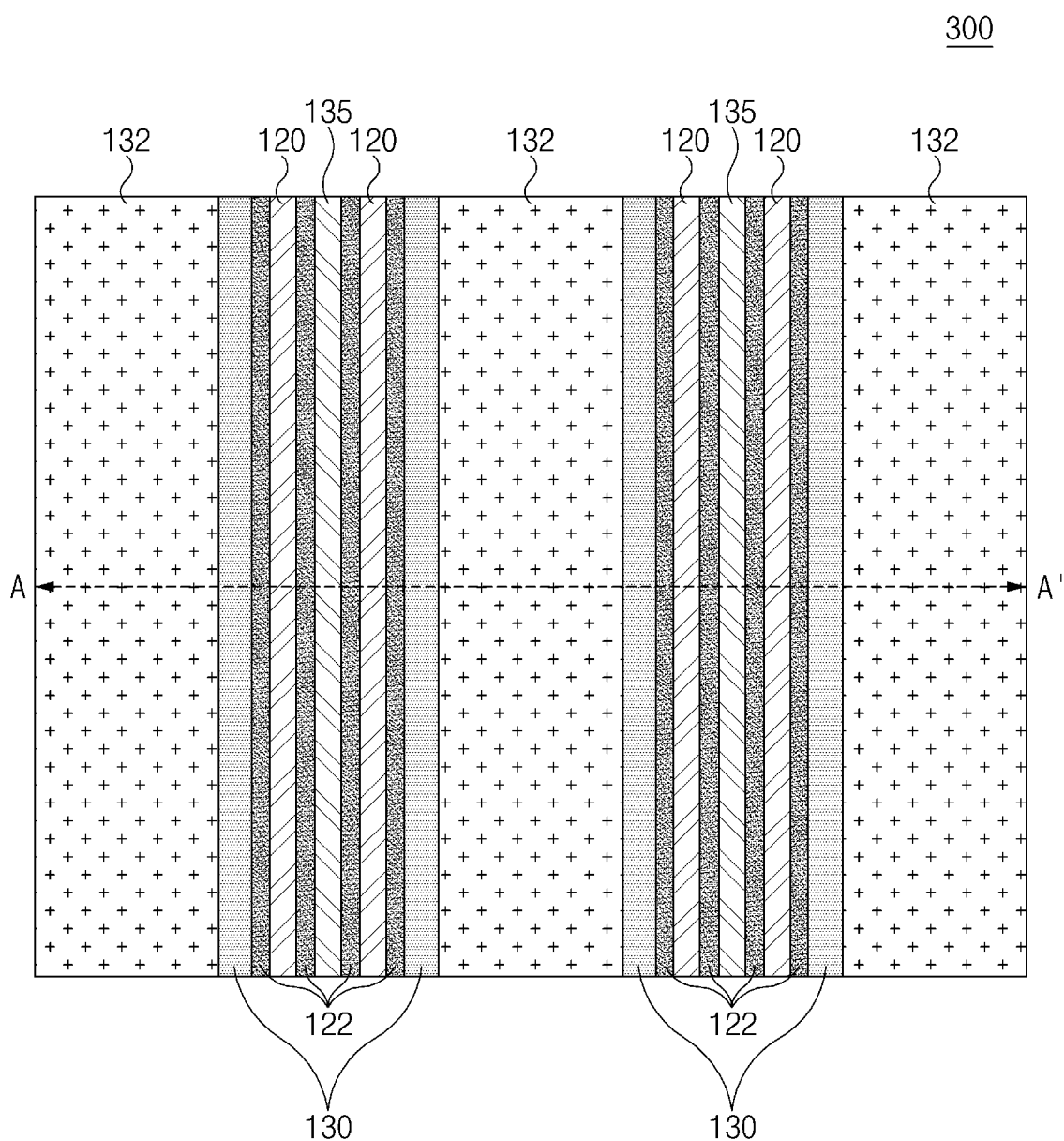
FIG. 3 is a view illustrating a portion of a cell region illustrated in FIG. 2.
Figure 4:
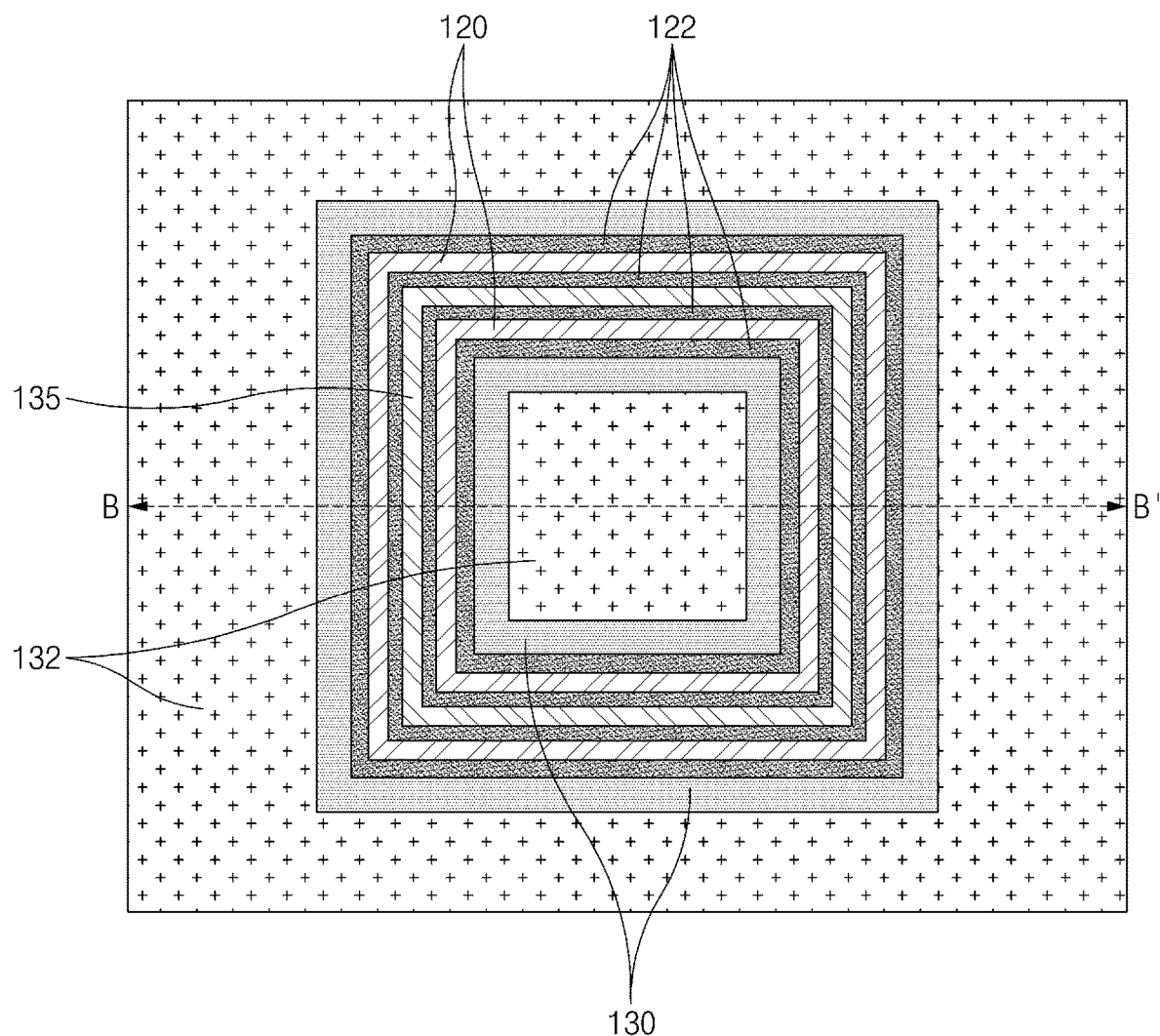
FIG. 4 is a view illustrating another example of a portion of a cell region illustrated in FIG. 2.

The cell region 100 may include at least one power semiconductor device 10. For example, the arrangement form of the power semiconductor device 10 may correspond to a stripe type as illustrated in FIG. 3 or a closed type as illustrated in FIG. 4. Such an arrangement form will be described later with reference to FIGS. 3 and 4.

The cell region 100 may further include a device for monitoring the state of at least one power semiconductor device 10.

According to an embodiment, the cell region 100 may further include a current sensing transistor substantially the same as the power semiconductor device 10 and having a structure reduced at a predetermined ratio. For example, the current sensing transistor may be connected in parallel to the IGBT of the power semiconductor device 10. In this case, a specific resistor may be connected between one terminal of the current sensing transistor and one terminal of the IGBT in the parallel connection. An output current of the current sensing transistor (e.g., the output current from the emitter terminal or collector terminal) may have a ratio associated with a specific ratio to the output current from the power semiconductor device 10, and the output current from the current sensing transistor may be used to indirectly monitor the state of the power semiconductor device 10.

According to another embodiment, the cell region 100 may further include a temperature sensor disposed adjacent to the power semiconductor device 10 to sense the temperature of the power semiconductor device 10. For example, the temperature sensor may include a junction diode which outputs a current varying depending on a temperature. The current of the junction diode may be used to monitor the temperature of the power semiconductor device 10.

The peripheral region 200 may be disposed outside the cell region 100 while surrounding the cell region 100. The peripheral region 200 may include a plurality of terminals for electrical connection between an external circuit (e.g., a driving circuit, a load, or a test circuit) and the cell region 100. The plurality of terminals may include a gate terminal G, an emitter terminal E, and a collector terminal C of the IGBT. In addition, the plurality of terminals may include each terminal of the current sensing transistor and/or the temperature sensor that may be included in the cell region 100.

FIG. 3 is a view illustrating a portion of a cell region illustrated in FIG. 2.

Referring to FIG. 3, a part 300 of the cell region 100 of FIG. 2 is illustrated. The cell region 100 may have the form in which the part 300 of the cell region 100 is repeatedly arranged in a vertical direction or a horizontal direction, when employing the part 300 of the cell region 100 as one unit, but the present disclosure is not limited thereto.

The part 300 of the cell region 100 may include a gate electrode 120, a gate insulating film 122, an emitter region 130, an emitter electrode 132, and a trench emitter region 135.

The gate electrode 120 corresponds to the gate of the IGBT in FIG. 1, and the gate insulating film 122 may electrically separate the gate electrode 120 from another component. The emitter region 130 may correspond to the emitter electrode 132, and the trench emitter region 135 may correspond to the emitter of the IGBT in FIG. 1.

The part 300 of the cell region 100 represents a plane positioned at a specific height when viewed in a vertical cross section of the cell region 100, and a component corresponding to the collector of the IGBT in FIG. 1 may be positioned at a height different from that of the part 300 of the cell region 100.

Meanwhile, the detailed structure, the function, and the material of each of the gate electrode 120, the gate insulating film 122, the emitter region 130, the emitter electrode 132, and the trench emitter region 135 will be described later with reference to FIG. 5A. Referring to FIG. 3, the arrangement form of the gate electrode 120, the gate insulating film 122, the emitter region 130, the emitter electrode 132, and the trench emitter region 135 when viewed on a plan view will be described.

The gate electrode 120 may extend in one direction (the vertical direction in FIG. 3). The gate insulating film 122 may extend in parallel to the gate electrode 120 in one direction while making contact with the left or right side of the gate electrode 120.

The emitter region 130 may extend in parallel to the gate electrode 120 in one direction, while making contact with the gate insulating film 122 disposed on the left side of the gate electrode 120 or the gate insulating film 122 disposed on the right side of the gate electrode 120. In other words, the gate insulating film 122 may be interposed between the gate electrode 120 and the emitter region 130, and the gate electrode 120 and the emitter region 130 may be electrically isolated from each other by the gate insulating film 122.

The trench emitter region 135 may be disposed inside the adjacent gate electrodes 120 while being spaced apart from each of the gate electrodes 120, and the gate insulating film 122 may be interposed between each of the gate electrodes 120 and the trench emitter region 135 to electrically isolate each gate electrode 120 from the trench emitter region 135. The trench emitter region 135 may extend in parallel to each of the gate electrodes 120.

Unit cells, each of which includes the trench emitter region 135, the gate electrodes 120 disposed on opposite sides of the trench emitter region 135, the emitter regions 130 disposed on the left and right sides of gate electrode 120, and the gate insulating films 122 to electrically isolate the components from each other, may be arranged while being space apart from each other in another direction perpendicular to one direction (in the horizontal direction in FIG. 3). As illustrated in FIG. 3, emitter electrodes 132 may be disposed at the left and right sides of the unit cell, which is positioned at the left side, to make contact with the unit cell. As illustrated in FIG. 3, emitter electrodes 132 may be disposed at the left and right sides of the unit cell, which is positioned at the right side, to make contact with the unit cell. Accordingly, the emitter electrode 132 may be interposed between unit cells spaced apart from each other in the another direction.

Since the unit cells has a stripe shape as in FIG. 3, the arrangement form of the power semiconductor device 10 may be defined as a stripe type.

FIG. 4 is a view illustrating another example of a portion of a cell region illustrated in FIG. 2.

Referring to FIG. 4, a part 400 of the cell region 100 of FIG. 2 is illustrated. The cell region 100 may have the form in which the part 400 of the cell region 100 is repeatedly arranged in a vertical direction or a horizontal direction, when employing the part 400 of the cell region 100 as one unit, but the present disclosure is not limited thereto.

Since the part 400 of the cell region 100 is substantially the same as the part 300 of the cell region 100 described in FIG. 3, except for an arrangement form, the duplication thereof will be omitted to avoid redundancy.

The gate electrode 120 may have a rectangular ring shape. The gate insulating film 122 may extend in parallel to the gate electrode 120 while making contact with one side of the gate electrode 120.

The emitter region 130 may extend in parallel to the gate electrode 120, while making contact with the gate insulating film 122 disposed on one side of the gate electrode 120 or the gate insulating film 122 disposed on an opposite side of the gate electrode 120. In other words, the gate insulating film 122 may be interposed between the gate electrode 120 and the emitter region 130, and the gate electrode 120 and the emitter region 130 may be electrically isolated from each other by the gate insulating film 122.

The trench emitter region 135 may be interposed between the adjacent gate electrodes 120 while being spaced apart from each of the gate electrodes 120, and the gate insulating film 122 may be interposed between each of the gate electrodes 120 and the trench emitter region 135 to electrically isolate each gate electrode 120 from the trench emitter region 135. The trench emitter region 135 may extend in parallel to each of the gate electrodes 120.

Unit cells, each of which includes a trench emitter region 135, gate electrodes 120 surrounded by the trench emitter region 135 or surrounding the trench emitter region 135, emitter regions 130 surrounded by the gate electrodes 120 or surrounding the gate electrodes 120, and gate insulating films 122 to electrically isolate the above components from each other may substantially have a rectangular ring shape.

As illustrated in FIG. 4, emitter electrodes 132 may be disposed at the left and right sides of the unit cell to make contact with the unit cell.

Since the unit cell has a ring shape as in FIG. 4, the arrangement form of the power semiconductor device 10 may be defined as a closed type.

The stripe type illustrated in FIG. 3 may be realized at a higher channel density (the density of a channel between the emitter and collector), which is advantageous in terms of a static characteristic of the IGBT. The closed type illustrated in FIG. 4 may more easily adjust the size and the ratio of a parasitic capacitance, which is advantageous in terms of switching stability of the IGBT. The stripe type or the closed type may be selected depending on the use and the requirements of the IGBT.

According to another embodiment, the cell region 100 may be realized in a ladder type which is a merge type of the stripe type and the closed type. The ladder type may refer to a form in which some of the gate electrodes 120 are spaced apart from each other by a specific distance while extending in one direction, which is similar to a stripe type, and others of the gate electrodes 120 extend in a direction perpendicular to the one direction to connect the some of the gate electrodes 120 belonging the stripe type. The ladder type may have the stripe type and the closed type.

Figure 5A:
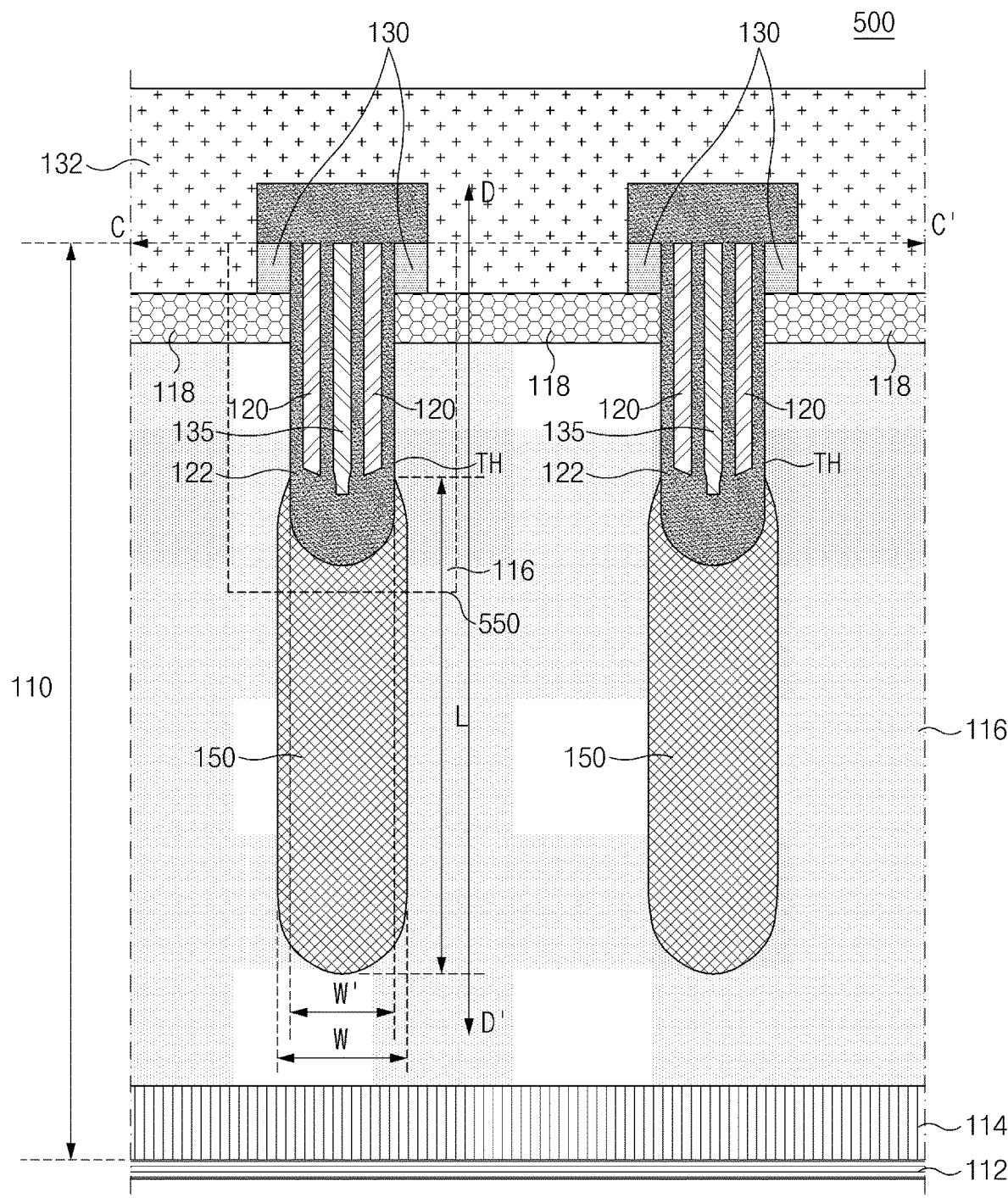
FIG. 5A is a view illustrating a cross section of a cell region of FIG. 3 or 4.
Figure 5B:
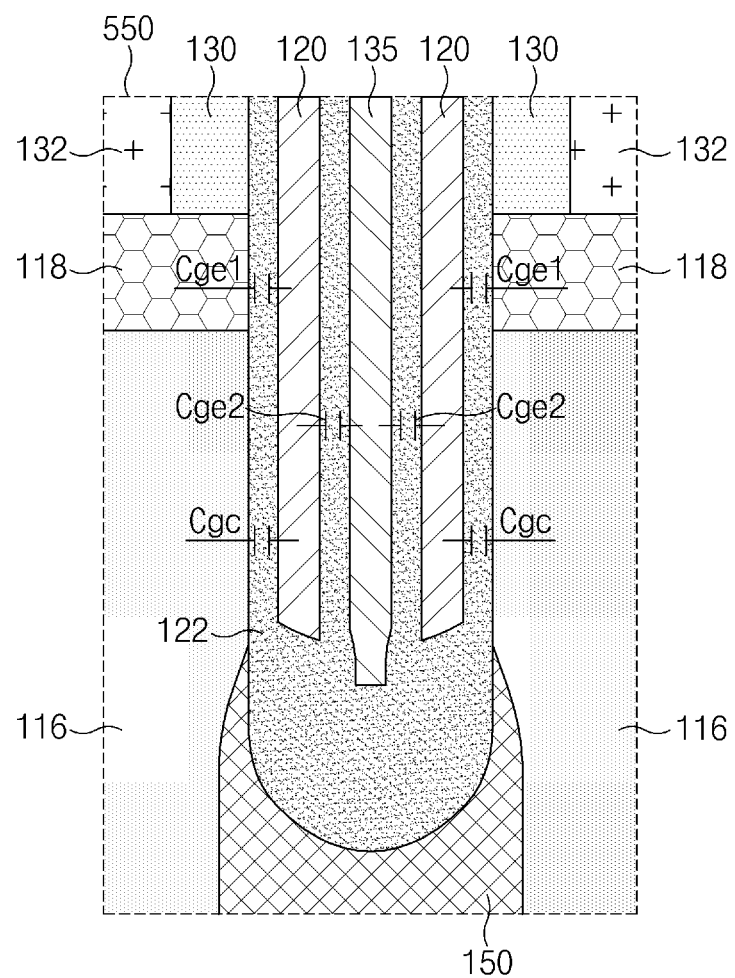
FIG. 5B is an enlarged view illustrating a partial region of FIG. 5A.
Figure 5C:
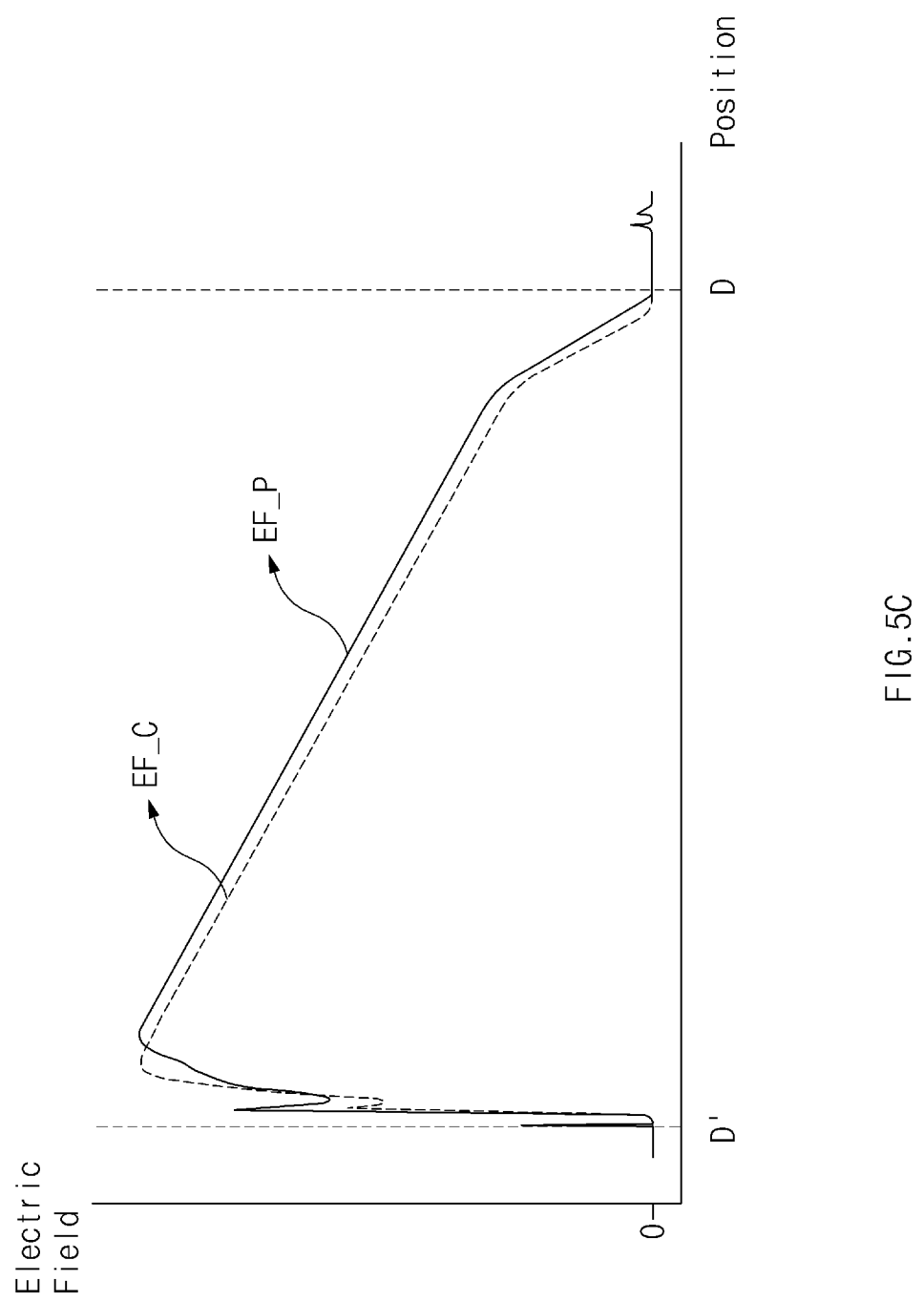
FIG. 5C is a graph illustrating the distribution of an electric field in the structure illustrated in FIG. 5A.
Figure 5D:
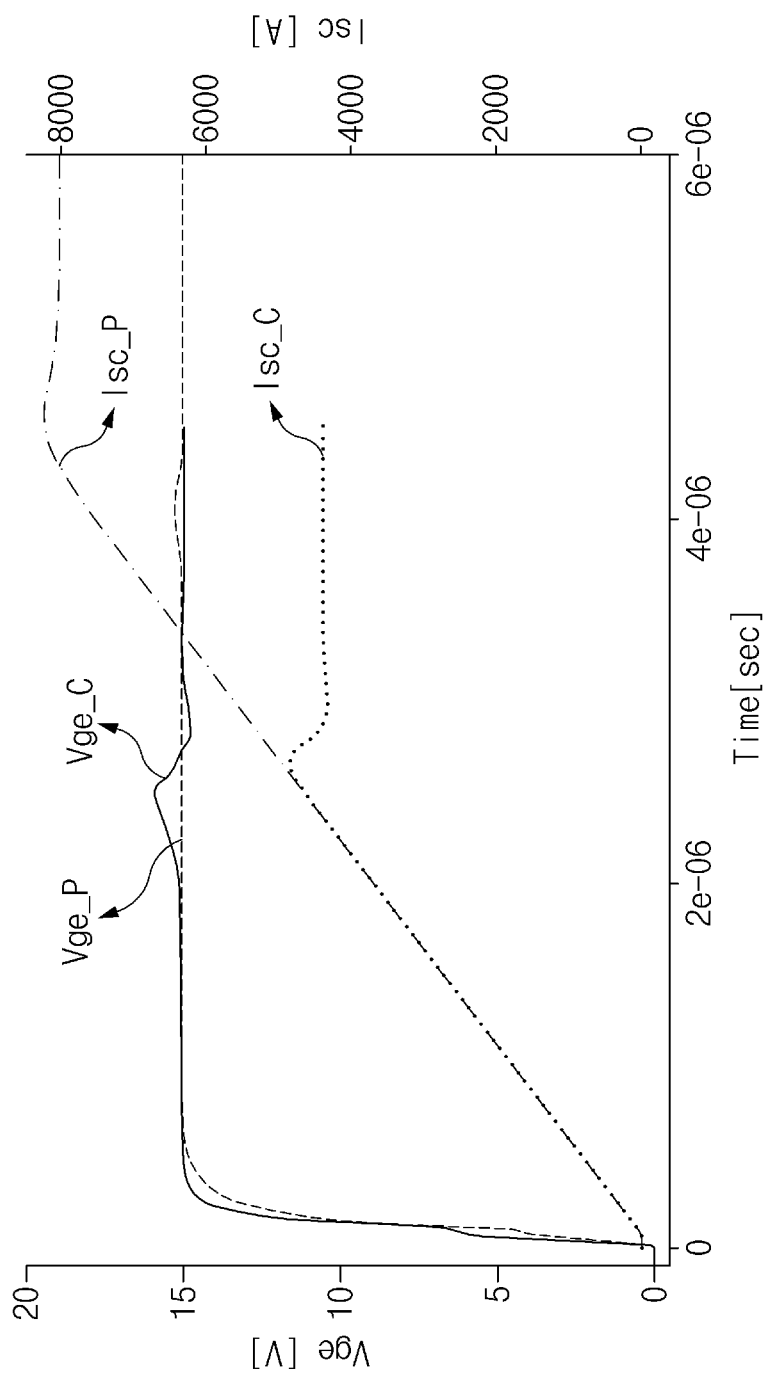
FIG. 5D is a graph illustrating the waveform of an electrical short circuit in the structure illustrated in FIG. 5A.

FIG. 5A is a view illustrating a cross section of a cell region of FIG. 3 or 4; FIG. 5B is an enlarged view illustrating a partial region of FIG. 5A. FIG. 5C is a graph illustrating the distribution of an electric field in the structure illustrated in FIG. 5A. FIG. 5D is a graph illustrating the waveform of an electrical short circuit in the structure illustrated in FIG. 5A.

FIG. 5A illustrates a cross section 500 of the cell region 100 taken along first line A-A' of FIG. 3 or second line B-B' of FIG. 4, and the first line A-A' or the second line B-B' may correspond to third line C-C' of FIG. 5A.

The cross section 500 may include a semiconductor substrate 110, a collector electrode 112 disposed at a lower portion of the semiconductor substrate 110, and the gate insulating film 122 and the emitter electrode 132 having at least a portion protruding from an upper portion of the semiconductor substrate 110

The semiconductor substrate 110 may refer to at least one semiconductor material layer (for example, an epitaxial layer). For example, the semiconductor substrate 110 may include a semiconductor material as silicon, germanium, or a silicon-germanium-based semiconductor material. The semiconductor substrate 110 may refer to a region from the third line C-C' to a lower end of the collector electrode 112.

The semiconductor substrate 110 may include a collector region 114, a drift region 116, a well region 118, a gate electrode 120, a portion of a gate insulating film 122, an emitter region 130, a portion of an emitter electrode 132, a trench emitter region 135, and a floating region 150. The semiconductor substrate 110 may include a top surface (or the first surface) and a bottom surface (or the second surface).

The collector region 114 may include impurities in a second conductive type. The second conductive type may be a P type or an N type, and may be an opposite conductive type of a first conductive type. The collector region 114 may be formed to have a specific thickness while making contact with the bottom surface of the semiconductor substrate 110. The collector region 114 may be disposed to make contact with the collector electrode 112 under the collector region 114. The collector electrode 112 may be electrically connected to the collector terminal C of FIG. 1, and may include at least one of polysilicon, metal, a metal nitride, or a metal silicide.

The collector region 114 and the collector electrode 112 may correspond to the collector of the IGBT of FIG. 1.

The drift region 116 may include impurities in the first conductive type. The first conductive type may be a P type or an N type, and may be an opposite conductive type of the second conductive type. The drift region 116 may provide a vertical movement path of charges (holes and electrons) between the collector region 114 and the emitter region 130. The drift region 116 is disposed under the collector region 114 and may extend in the extension direction of a trench TH (the vertical direction in FIG. 5A) while making contact with the side surfaces of each of the floating region 150 and the trench TH.

The well region 118 may include impurities in the second conductive type. The well region 118 may be disposed between the drift region 116 and the emitter region 130 and between the drift region 116 and the emitter electrode 132. In addition, the well region 118 may be interposed between adjacent trenches TH provided therein with the gate electrode 120 and the gate insulating film 122. The well region 118 may be disposed to make contact with the drift region 107, the gate insulating film 122, the emitter region 130, and the emitter electrode 132. The trench TH may refer to a structure recessed to a specific depth from one surface of the semiconductor substrate 110 toward an opposite surface of the semiconductor substrate 110.

The depth from the top surface of the semiconductor substrate 110 to a bottom surface of the well region 118 may be shallower than the depth from the top surface of the semiconductor substrate 110 to a bottom surface of the trench TH.

The gate electrode 120 may include a material having conductivity and may include at least one of polysilicon, metal, a metal nitride, or a metal silicide. The gate electrode 120 may be disposed to fill the inside of the trench TH while making contact with the gate insulating film 122. Accordingly, the gate electrode 120 may have a shape recessed to a specific depth from the top surface of the semiconductor substrate 110 toward the bottom, surface of the semiconductor substrate 110.

The gate electrode 120 may include two parts separated from each other in the trench TH. In other words, the trench emitter region 135 may be disposed at the center of the trench TH, and the gate electrodes 120 may be disposed on left and right sides of the trench emitter region 135.

The gate electrode 120 may extend in parallel to the trench emitter region 135 from the top surface of the semiconductor substrate 110 toward the bottom surface of the semiconductor substrate 110. The length of the gate electrode 120 extending from the top surface of the semiconductor substrate 110 may be shorter than the length of the trench emitter region 135 extending from the top surface of the semiconductor substrate 110, but the scope of the present disclosure is not limited thereto.

The gate electrode 120 may correspond to a gate of the IGBT of FIG. 1 and may be electrically connected to the gate terminal G of FIG. 1.

The gate insulating film 122 may include an insulating material, for example, at least one of an insulating material, for example, a silicon oxide, a silicon nitride, a germanium oxide, a germanium nitride, a hafnium oxide, a zirconium oxide, or an aluminum oxide. The gate insulating film 122 may be disposed to make contact with the gate electrode 120 inside the trench TH, while extending along the side surface of the trench TH. In addition, the gate insulating film 122 may extend to the outside of the semiconductor substrate 110 and be disposed above the gate electrode 120, the emitter region 130, and the trench emitter region 135. The gate insulating film 122 extending to the outside of the semiconductor substrate 110 may be referred to as an interlayer insulating layer.

The gate insulating film 122 positioned inside the trench TH may be interposed between the surface of the trench TH and the gate electrode 120, between the gate electrode 120 a region (that is, an upper region) of the trench emitter region 135, and between the gate electrode 120 and the trench emitter region 135.

The gate insulating film 122 may electrically isolate the gate electrode 120 from each of the drift region 116, the well region 118, the emitter region 130, the emitter electrode 132 and the floating region 150. In addition, the gate insulating film 122 may electrically isolate the gate electrode 120 and the trench emitter region 135 from each other.

The thickness of the gate insulating film 122 interposed between the side surface of the trench TH and the gate electrode 120 may be thinner than the thickness of the gate insulating film 122 positioned between the bottom surface of the trench TH and the gate electrode 120.

The well region 130 may include impurities in the first conductive type. The doping concentration of impurities in the first conductive type in the emitter region 130 may be heavier than the doping concentration of impurities in the first conductivity type in the drift region 116. The emitter region 130 may make contact with the top surface of the semiconductor substrate 110, and may be interposed between the gate insulating film 122 in the trench TH and the emitter electrode 132 while making contact with each of the gate insulating film 122 (or the trench TH) and the emitter electrode 132. In addition, the bottom surface of the emitter region 130 may be disposed to make contact with the well region 118. The emitter region 130 may be disposed on one side and the opposite side (or both left and right sides) of the trench TH, respectively.

The gate electrode 132 may include a material having conductivity and may include at least one of polysilicon, metal, a metal nitride, or a metal silicide. The emitter electrode 132 may be disposed to cover the upper portion of the semiconductor substrate 110 while making contact with the gate insulating film 122 protruding outside the semiconductor substrate 110, the well region 118, and the emitter region 130.

The emitter electrode 132 may apply a voltage, which is lower than a voltage across a collector of the IGBT, to the well region 110 by serving as a contact to the well region 118. Regarding the emitter region 130, the emitter electrode 132 may serve as an electrode to electrically connect the emitter region 130 to the emitter terminal E of FIG. 1. The collector region 130 and the collector electrode 132 may correspond to the emitter of the IGBT of FIG. 1.

The trench emitter region 135 may include a material having conductivity and may include at least one of polysilicon, metal, a metal nitride, or a metal silicide. The trench emitter region 135 may be interposed between the gate electrodes 120. In addition, the trench emitter region 135 may be disposed to make contact with the gate insulating film 122 to be electrically isolated from the surfaces of the gate electrodes 120 and the trench TH.

The gate electrode 135 may extend in parallel to the gate electrode 120 from the top surface of the semiconductor substrate 110 toward the bottom surface of the semiconductor substrate 110. The length of the trench emitter region 135 extending from the top surface of the semiconductor substrate 110 may be longer than the length of the gate electrode 120 extending from the top surface of the semiconductor substrate 110, but the scope of the present disclosure is not limited thereto.

The trench emitter region 135 may be electrically connected to the emitter electrode 132, and may correspond to the emitter of the IGBT of FIG. 1 together with the emitter region 130 electrically connected to the emitter electrode 132. As a contact hole is formed at an arbitrary (not illustrated) of the cell region 100 or the peripheral region 200, by removing at least a portion of the gate insulating film 122 at the upper portion of the trench emitter region 135, the trench emitter region 135 may be electrically connected to the emitter electrode 132 through the contact hole, but the present disclosure is not limited thereto, The floating region 150 may include impurities in the second conductive type. The floating region 150 may be an electrically floating region having bias voltage applied thereto from the outside.

The floating region 150 may extend toward the collector region 114 in the extension direction (the vertical direction of FIG. 5A) of the trench TH while surrounding the bottom surface of the trench TH.

The floating region 150 may have a width W wider than a width W' of the trench TH to surround the entire bottom surface of the trench TH. When the floating region 150 is not included, an electric field may be concentrated on the bottom surface of the trench TH during operation of the IGBT, such that the maximum electric field may be formed on the bottom surface of the trench (TH). Since the thickness of the gate insulating film 122 is only about several hundred nm, the breakdown voltage of the IGBT may be decreased, as the electric field is concentrated on the bottom surface of the trench TH. As the breakdown voltage is decreased, the normal switching operation of the IGBT may be difficult. However, according to the present disclosure, when the floating region 150 surrounds the entire portion of the bottom surface of the trench TH, the electric field is distributed into the floating region 150 instead of being concentrated on the bottom surface of the trench TH due to a charge sharing phenomenon. Accordingly, the maximum electric field may be formed on the bottom surface of the floating region 150. Accordingly, the breakdown voltage of the IGBT is not decreased, but the switching performance of the IGBT may be ensured. In other words, since the IGBT may perform the switching operation under the higher voltage environment due to the floating region 150, the withstand voltage characteristic may be improved. In addition, since the gate insulating film 122 positioned under the gate electrode 120 has a thickness thicker than that of the gate insulating film 122 positioned on the side surface of the gate electrode 120, the electric field may be prevented from being concentrated on the bottom surface of the trench TH.

As the position of the maximum electric field is moved due to the floating region 150 and the internal structure of the trench TH, the margin for the breakdown voltage of the IGBT may be ensured. Accordingly, the doping concentration of impurities in the first conductive type in the drift region 116 may be set to be heavier to increase the density of a carrier (e.g., a hole) when the IGBT is turned on, such that the switching performance is improved Accordingly, the obtained effect may be the substantially same as that the spacing between mutually adjacent trenches TH may be reduced to increase the channel density.

FIG. 5C illustrates an electric field distributed line D-D' illustrated in FIG. 5A. A first electric field EF_P is one example of an electric field distributed in line D-D' marked in FIG. 5A. A second electric field EF_C is an example of an electric field at a position corresponding to line D-D' in a structure (that is, a gate electrode is filled in the trench TH without the trench emitter region 135, and the floating region 150 is omitted, according to a comparative example of the present disclosure) without the emitter region 130 and the floating region 150, which are provided in the structure of FIG. 5A.

As the electric field is distributed due to the charge sharing phenomenon by the floating region 150, and the thicker thickness of the gate insulating film 122 positioned to be adjacent to the bottom surface of the trench TH, the first electric field EF_P may have the intensity of the electric field, which is substantially greater than the intensity of the second electric field EF_C. Accordingly, the area of the first electric field EF_P may be greater than the area of the second electric field EF_C. In this case, the area of the first electric field EF_P or the second electric field EF_C may refer to a value obtained by integrating the intensity of the electric field along line D-D'. In addition, the area of the first electric field EF_P or the area of the second electric field EF_C may indicate the intensity of the breakdown voltage of the IGBT. The breakdown voltage of the IGBT having the structure of FIG. 5A according to an embodiment of the present disclosure may be greater than the breakdown voltage of the IGBT having the structure according to a comparative example of the present disclosure.

Referring back to FIG. 5A, the bottom surface of the trench TH may have a substantially rounded shape such that an angled region is not present at a part extending from the bottom surface of the trench TH to the side surface of the trench TH. When the angled region is present under the trench TH, a breakdown voltage of the IGBT may be decreased, as an electric field is concentrated in the angled region. Accordingly, the trench TH according to the present disclosure may have a bottom surface having the substantially rounded shape to improve the withstand voltage characteristic.

The width W of the floating region 150 may be determined to be greater than the width W' of the trench TH with a difference of only a degree to surround the entire bottom surface of the trench TH. In other words, the width W of the floating region 150 may have a value significantly approximate to the width W' of the trench TH. Accordingly, one unit including the trench TH and the floating region 150 surrounding the lower portion of the trench TH may have a narrower width W, and may be reduced in pitch between mutually different gate electrodes 120, thereby increasing the element density of the cell region 100.

The collector-emitter charge movement path is formed in the drift region 116 between the gate electrodes 120 adjacent to each other and between the floating regions 150 adjacent to each other, when IGBT is operated. When the spacing between the gate electrodes 120 adjacent to each other and the spacing between the floating regions 150 adjacent to each other is reduced, the channel density between the collector and the emitter is increased to increase the gain of the IGBT, and the carrier movement between the collector and the emitter is made easy to reduce the JFET resistance, thereby improving the switching performance. However, when the spacing between the gate electrodes 120 adjacent to each other and the spacing between the floating regions 150 is excessively reduced, the area of the charge movement path is reduced to increase the turn-on resistance of the IGBT. In particular, when the spacing between the floating regions 150 adjacent to each other is excessively reduced, the area of the charge movement path is more narrowed due to the depletion region formed due to the junction between the floating region 150 and the drift region 116. The increase in the turn-on resistance (the ratio of a voltage Vce to a current Ice between the emitter and the collector) of the IGBT may lower the switching speed of the IGBT. Accordingly, the doping concentration of the impurities in the first conductive type in the drift region 116 (a drift region above a virtual line extending through a lower end of the floating region 150 and parallel to one surface of the semiconductor substrate 110) between the gate electrodes 120 adjacent to each other and between the floating regions 150 adjacent to each other is relatively increased the doping concentration of impurities in the first conductive type in the drift region 116 (that is, a drift region under the virtual line extending through the lower end of the floating region 150 and parallel to one surface of the semiconductor substrate 110) under the floating regions 150, thereby reducing the turn-on resistance of the IGBT.

The floating region 150 may have a length L extending from an upper end of the floating region 150 to a lower end of the floating region 150 in the extension direction of the trench TH. When viewed from the top surface of the semiconductor substrate 110, the depth to the upper end of the floating region 150 is shallower than the depth to the lower end of the trench TH, and deeper than the depth to the lower end of the well region 118. In addition, when viewed from the bottom surface of the semiconductor substrate 110, the depth to the lower end of the floating region 150 may be deeper than the depth to the upper end of the collector region 114. In other words, the lower end of the floating region 150 and the upper end of the collector region 114 may be spaced apart from each other by a specific distance.

The length L of the floating region 150 may be greater than the width W of the floating region 150, and may be determined to have a value as large as possible. As the floating region 150 is formed with a length as long as possible, the position for the maximum electric field may be adjusted to be as close as possible to the collector region 114. Accordingly, the breakdown voltage is increased to improve the withstand voltage characteristic.

Referring back to FIG. 5B, an enlarged view of a partial region 550 of FIG. 5A is illustrated. A gate-emitter first parasitic capacitance Cge1 may be made at the interface between the gate electrode 120 and the well region 118 disposed at one side (a left side or a right side) of the gate electrode 120. A gate-emitter second parasitic capacitance Cge2 may be made on the interface between the gate electrode 120 and the trench emitter region 135 disposed at one side (a left side or a right side) of the gate electrode 120. In addition, a gate-collector parasitic capacitance Cgc may be made at an interface between the gate electrode 120 and the drift regions 116 disposed on the left and right sides of the gate electrode 120.

The total gate-emitter parasitic capacitance Cge in the IGBT may be the sum of the first parasitic capacitance Cge1 made between the gate electrode 120 and the emitter region 130 and the second parasitic capacitance Cge2 made between the gate electrode 120 and the trench emitter region 135. In other words, since the trench emitter region 135 is present inside the trench TH, a significantly higher gate-emitter parasitic capacitance Cge (two times of a capacitance in the case that only the emitter region 130 is present) may be made in the trench TH, as compared to the case that only the emitter region 130 is present.

As the gate-emitter parasitic capacitance Cge is increased, the switching operation stability may be increased, but the switching speed may be decreased. Accordingly, the thickness of the gate insulating film 122, the doping concentration of the well region 118 and the emitter region 130, and the shape/material of the trench emitter region 135 may be adjusted such that the gate-emitter parasitic capacitance Cge has an appropriate value As illustrated in FIG. 5A, the gate insulating films 122 interposed between the gate electrode 120 and the well region 118, and between the gate electrode 120 and the trench emitter region 135 have thinner thicknesses, such that the gate-emitter parasitic capacitance Cge has a greater value.

The total gate-collector parasitic capacitance Cgc in the IGBT may be the sum of a parasitic capacitance made at the interface between the gate electrode 120 and the drift regions 116 positioned at the left and right sides, and a parasitic capacitance generated at the interface between the bottom surface of the floating region 150 and the drift region 116. The parasitic capacitance may be made in another region. However, the following description will be made while focusing on the main parasitic capacitance. In this case, the size of the parasitic capacitance generated at the interface between the bottom surface of the floating region 150 and the drift region 116 may be decreased, as the distance from the bottom surface of the gate electrode 120 to the bottom surface of the floating area 150 is increased. In other words, on the assumption that the upper depth of the floating region 150 is fixed, the gate-collector parasitic capacitance Cgc of the IGBT may be decreased, as the length L of the floating region 150 is increased.

In addition, the sizes of the parasitic capacitances made at the interface between the gate electrode 120 and the left and right drift regions 116 may be decreased, as the thickness of the gate insulating film 122 disposed under the gate electrode 120 is increased. In other words, as the length of the gate electrode 120 extending from the top surface of the semiconductor substrate 110 toward the bottom surface of the semiconductor substrate 110 is decreased, the size of the parasitic capacitance made at the interface between the gate electrode 120 and the left and right drift regions 116 may be decreased. For example, the distance between an arbitrary point of the drift region 116 adjacent to the upper end of the floating region 150 and the gate electrode 120 may be increased, as the length of the gate electrode 120 extending from the top surface of the semiconductor substrate 110 toward the bottom surface of the semiconductor substrate 110 is decreased, such that the size of the parasitic capacitance is reduced. In addition, the gate electrode 120 has a form in which the width of the gate electrode 120 is gradually reduced toward the lower end of the gate electrode 120, and the thickness of the gate insulating film 122 interposed between the gate electrode 120 and the drift region 116 may be increased. As the thickness of the gate insulating film 122 is increased, the size of the parasitic capacitance made at the interface between the gate electrode 120 and the left and right drift regions 116 may be gradually decreased. In addition, the gate electrode 120 has a shape gradually inclined to the trench emitter region 135 toward the lower end of the gate electrode 120, and the trench emitter region 135 has a length longer than that of the gate electrode 120, such that the gate-emitter parasitic capacitance is more increased.

Accordingly, the gate-collector parasitic capacitance Cgc may be adjusted by adjusting at least one of the depth of the floating region 150, the shape of the gate electrode 120, or the thickness of the gate insulating film.

In the power semiconductor device having the trench-type gate structure as illustrated in FIG. 5A, when carriers (e.g., holes) are excessively accumulated at an interface of the trench TH, a negative gate capacitance (NGC) phenomenon may occur and a displacement current may be generated The displacement current may degrade the switching operation stability of the IGBT and has a characteristic proportional to the size of the gate-collector parasitic capacitance Cgc.

According to the present disclosure, the gate-collector parasitic capacitance Cgc may be adjusted by adjusting at least one of the depth of the floating region 150, the shape of the gate electrode 120, or the thickness of the gate insulating film, thereby satisfying the necessary switching operation stability.

The switching loss and switching operation stability of the IGBT may depend on the capacitance ratio Cge/Cgc between the gate-emitter parasitic capacitance Cge and the gate-collector parasitic capacitance Cgc. As the capacitance ratio Cge/Cgc is increased, the switching loss may be reduced, and the switching operation stability may be increased.

The turn-on resistance, which is the ratio of a collector-emitter voltage Vce to a collector-emitter current Ice, may indicate the size of the switching loss of the IGBT when the IGBT is turned on. In other words, as the turn-on resistance is reduced, the switching loss of the IGBT may be decreased. In addition, the turn-on resistance may depend on the capacitance ratio Cge/Cgc. In detail, the turn-on resistance may be reduced in the structure, such as the structure of FIG. 5A, of relatively increasing the capacitance ratio Cge/Cgc, and the turn-on resistance may be decreased, thereby reducing the switching loss of the IGBT.

Referring to FIG. 5D, the overshooting degree, which is a characteristic in a short circuit state of the IGBT, of the gate-emitter voltage Vge in turning on the IBGT may indicate the switching operation stability of the IGBT. In other words, as the overshooting degree of the gate-emitter voltage Vge is decreased, the switching operation stability may be increased. FIG. 5D illustrates of a simulation result of the gate-emitter voltage Vge_P and the short circuit current Isc_P over time in the structure (See FIG. 5A) according to an embodiment of the present disclosure, and a simulation result of the gate-emitter voltage Vge_C and the short circuit current Isc_C in a structure (the structure without the trench emitter region 135 and the floating region 150 provided in the structure of FIG. 5A) according to a comparative example of the present disclosure over time, under the same condition (e.g., Vge (gate-emitter voltage) =15 V, Vce (collector-emitter voltage)=200 V, and Ron (turn-on resistance)=1 ohm).

Although the structure according to an embodiment of the present disclosure is tuned with a higher short circuit current as compared to the structure according to the comparative example of the present disclosure (Isc_P=8000 A, and Isc_C=4400 A), the peak value of Vge_P may be about 15.3 V and the peak value of Vge_C may be about 15.9 V. In other words, the structure (about 0.3 V) according to an embodiment of the present disclosure may have the overshooting degree of the gate-emitter voltage, which less than that of the structure (about 0.9 V) according to the comparative example of the present disclosure. In addition, the peak value of Isc_P may be about 8200 A and the peak value of Isc_C may be about 4800 A. In other words, the structure (about 200 A) according to an embodiment of the present disclosure may have the overshooting degree of the short-circuit current, which less than that of the structure (about 400 A) according to the comparative example of the present disclosure.

The overshooting degree of the gate-emitter voltage Vge may depend on the capacitance ratio Cge/Cgc. According to the structure, such as the structure of FIG. 5A, of relatively increasing the capacitance ratio Cge/Cgc, the overshooting degree of the gate-emitter voltage Vge may be decreased. Accordingly, the switching operation stability of the IGBT may be increased.

Figure 6A:
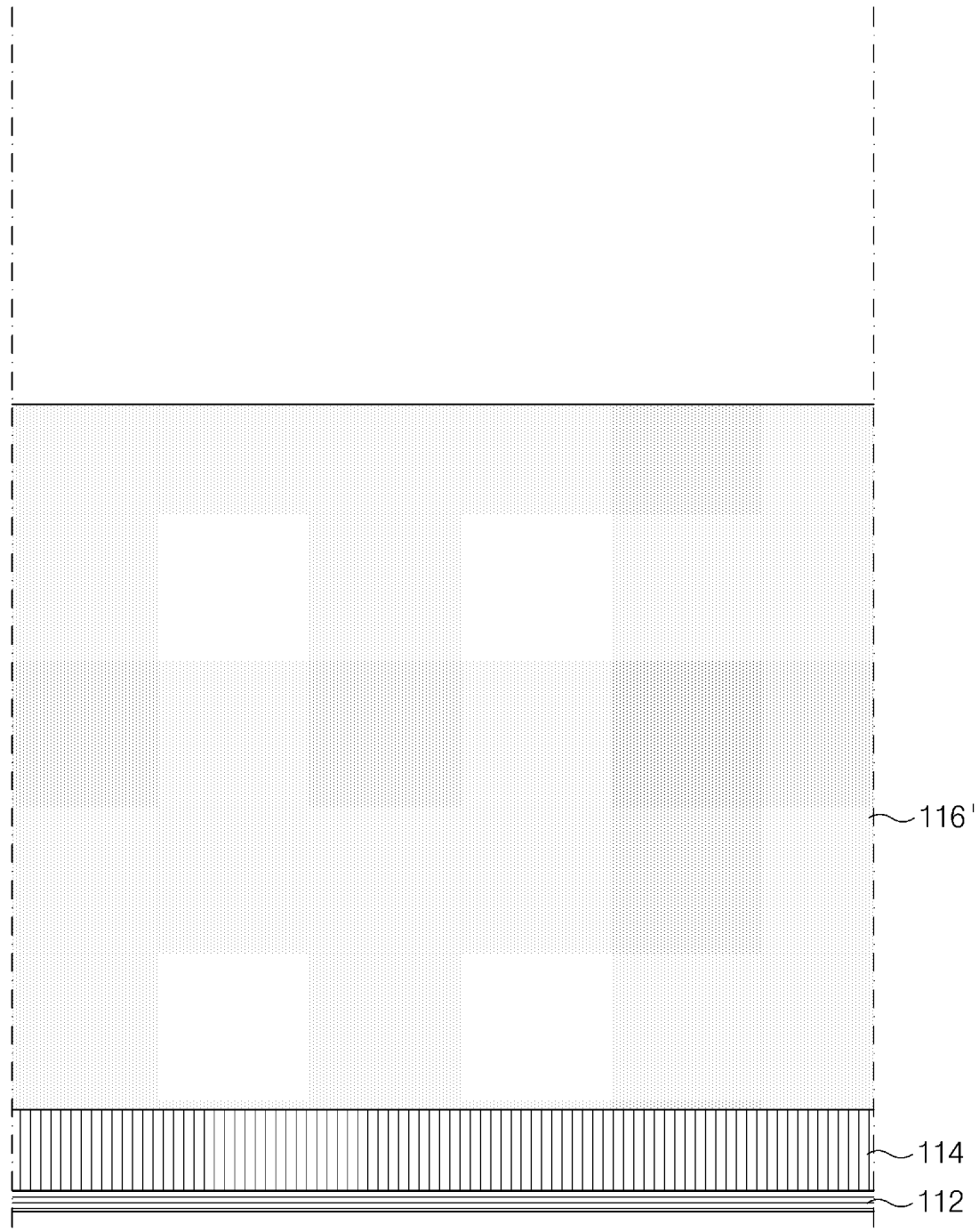
FIGS. 6A to 6O are views illustrating a method for manufacturing a power semiconductor device, according to an embodiment of the present disclosure.
Figure 6B:
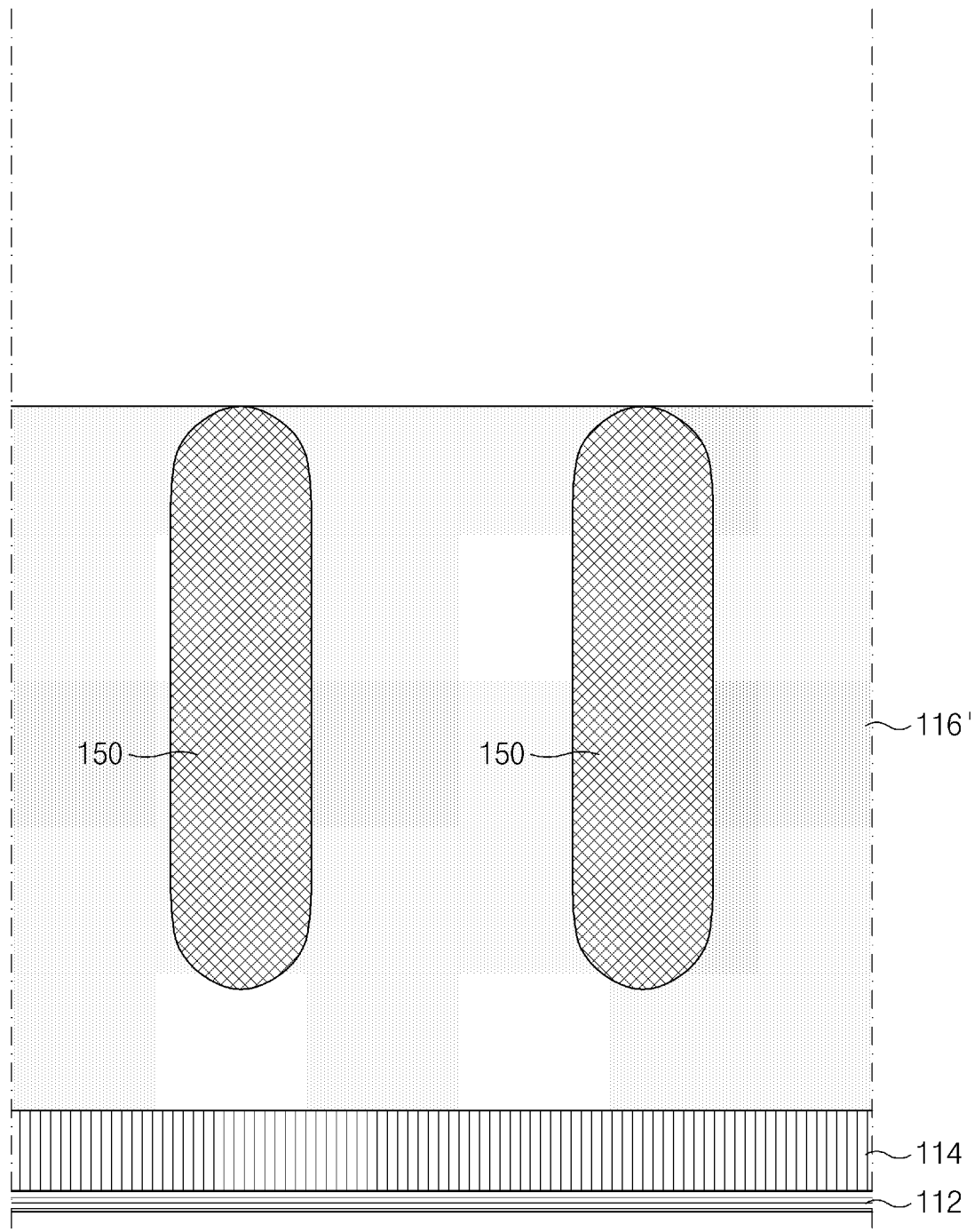
Figure 6C:
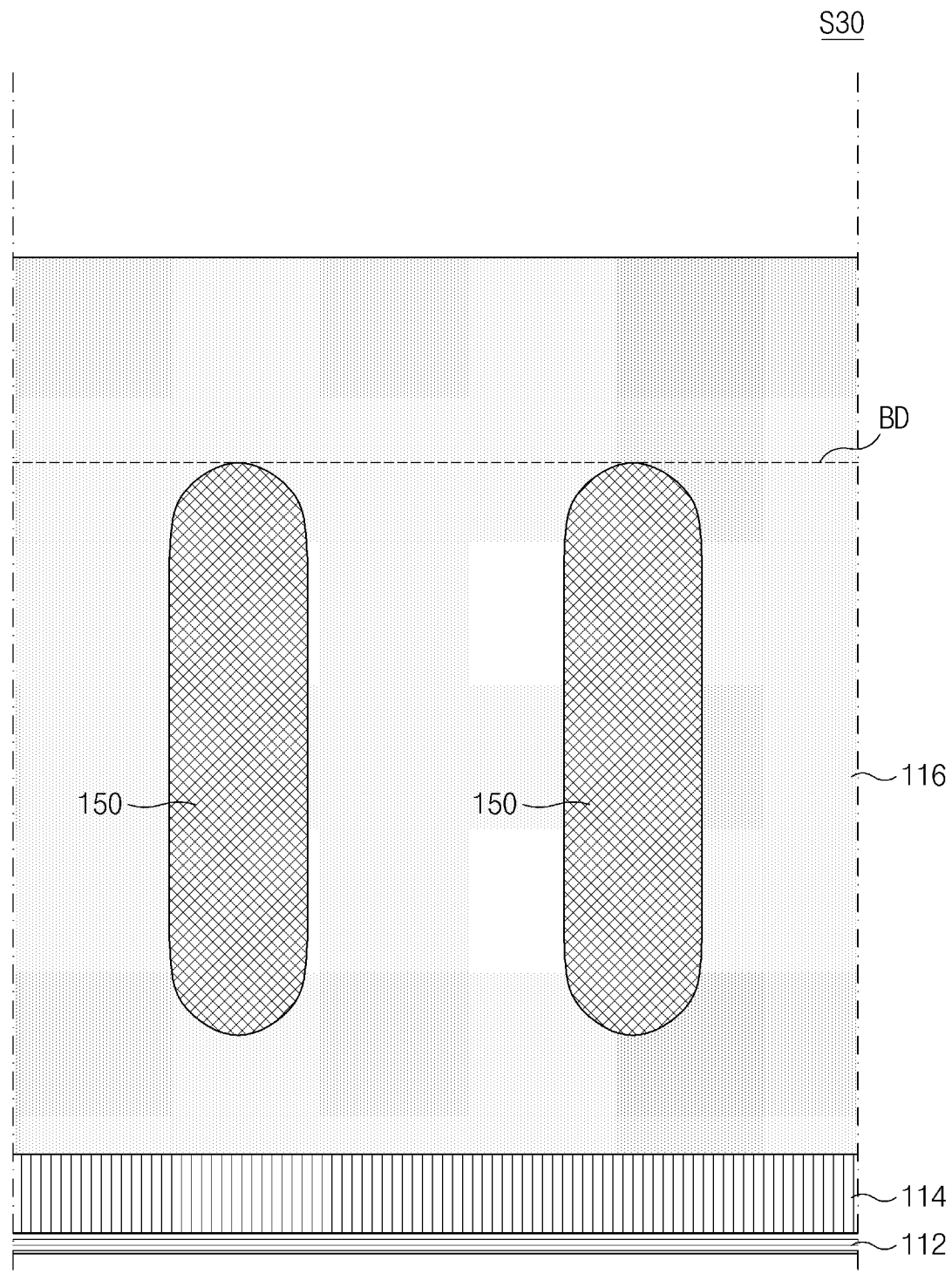
Figure 6D:
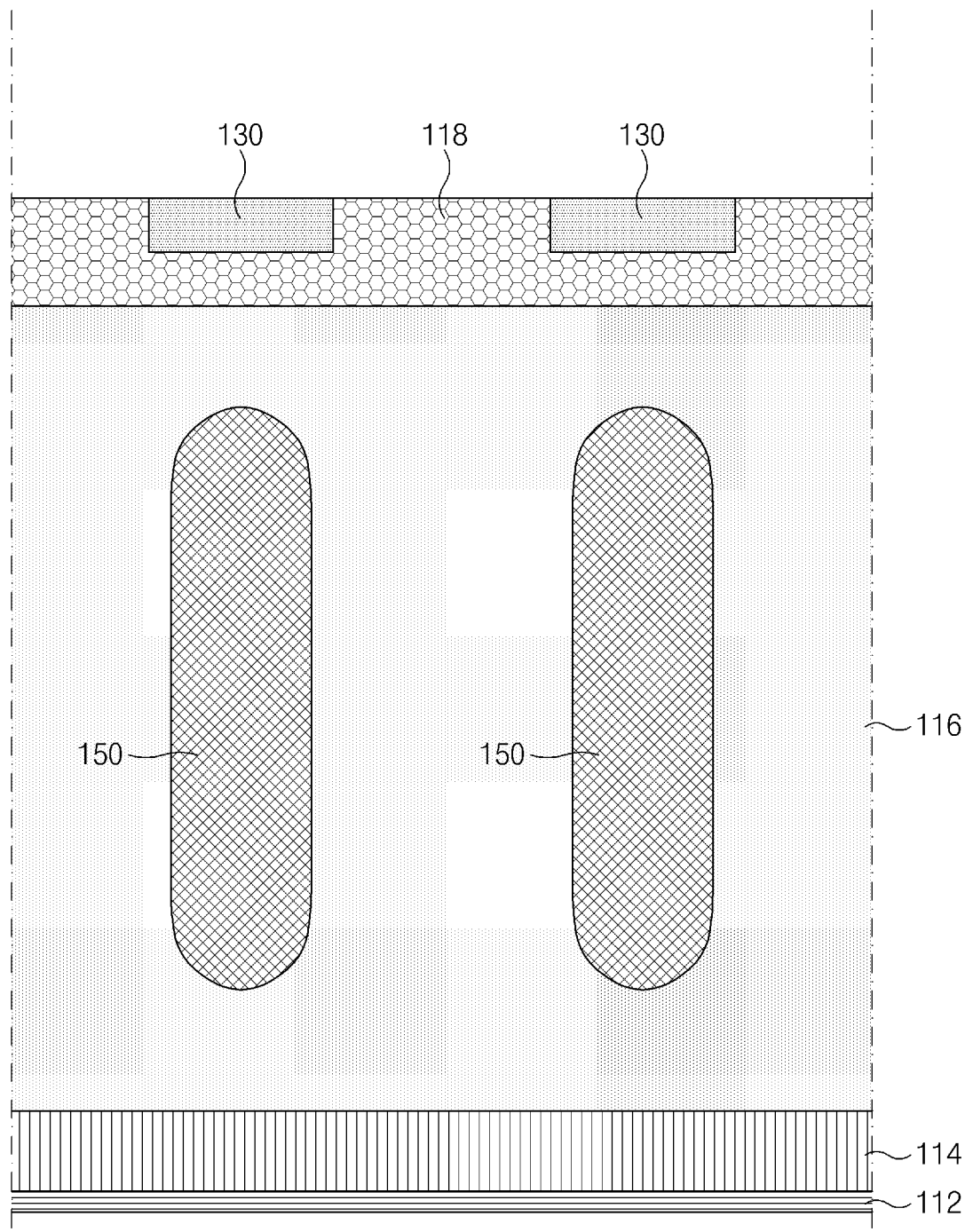
Figure 6E:
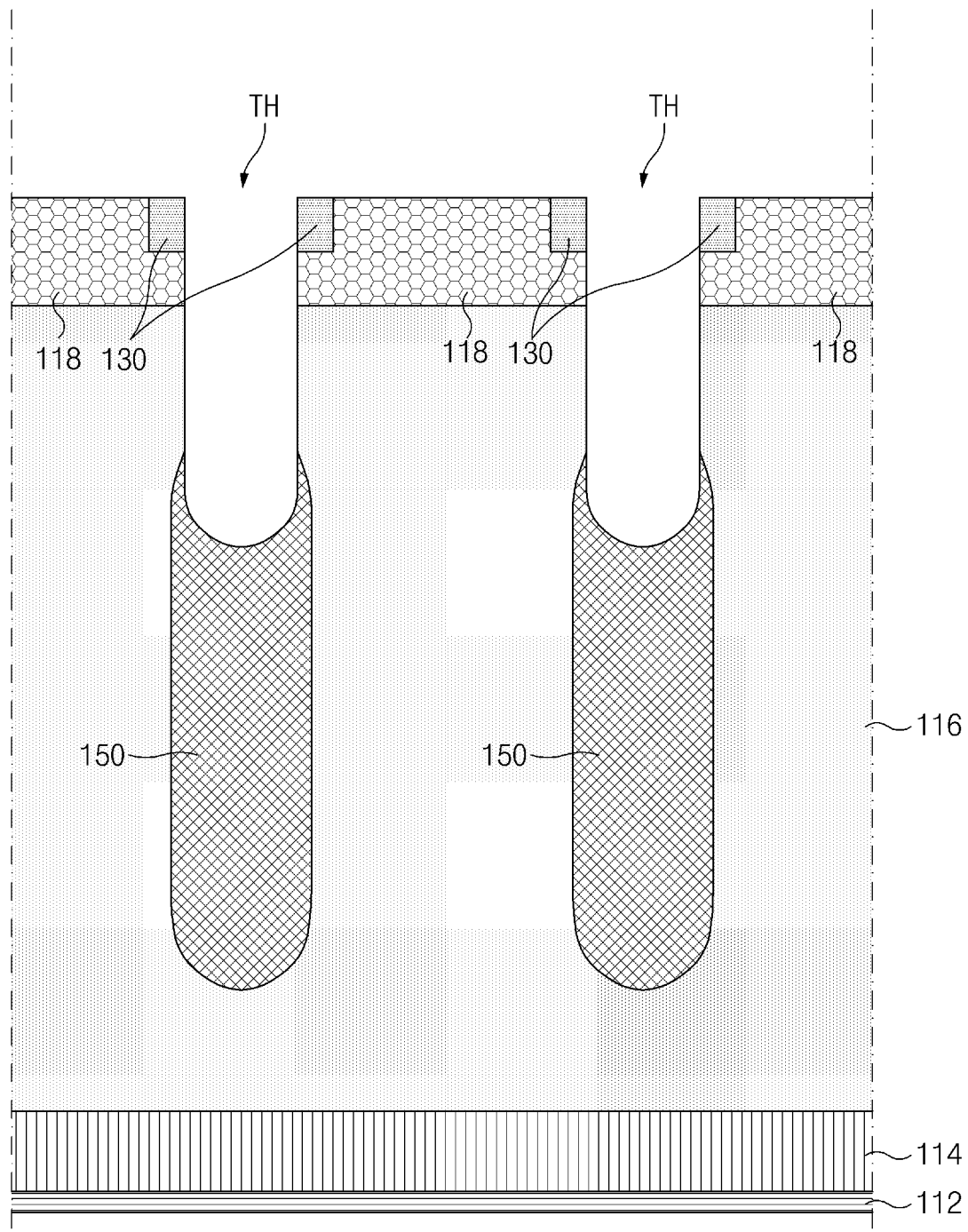
Figure 6F:
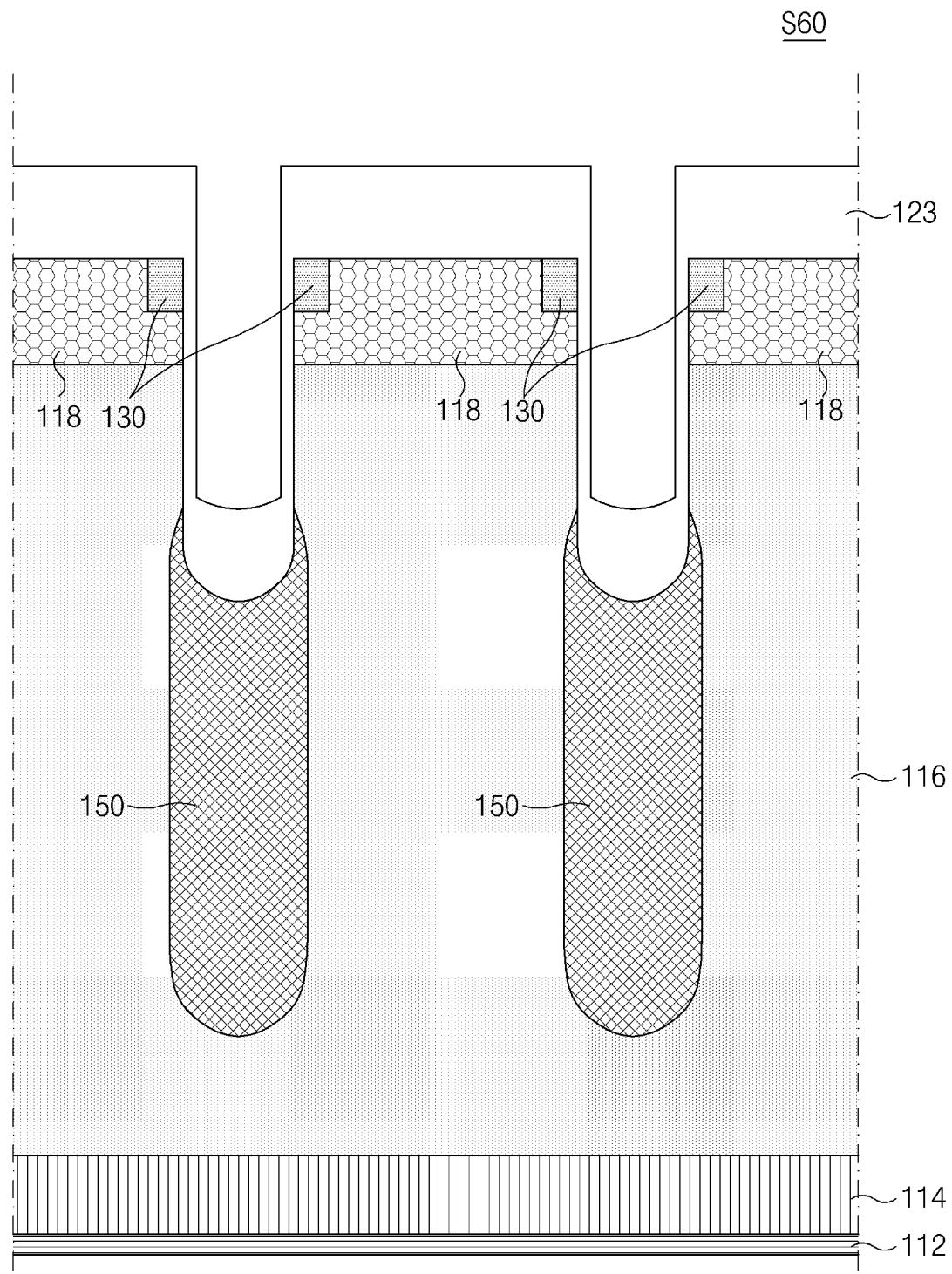
Figure 6G:
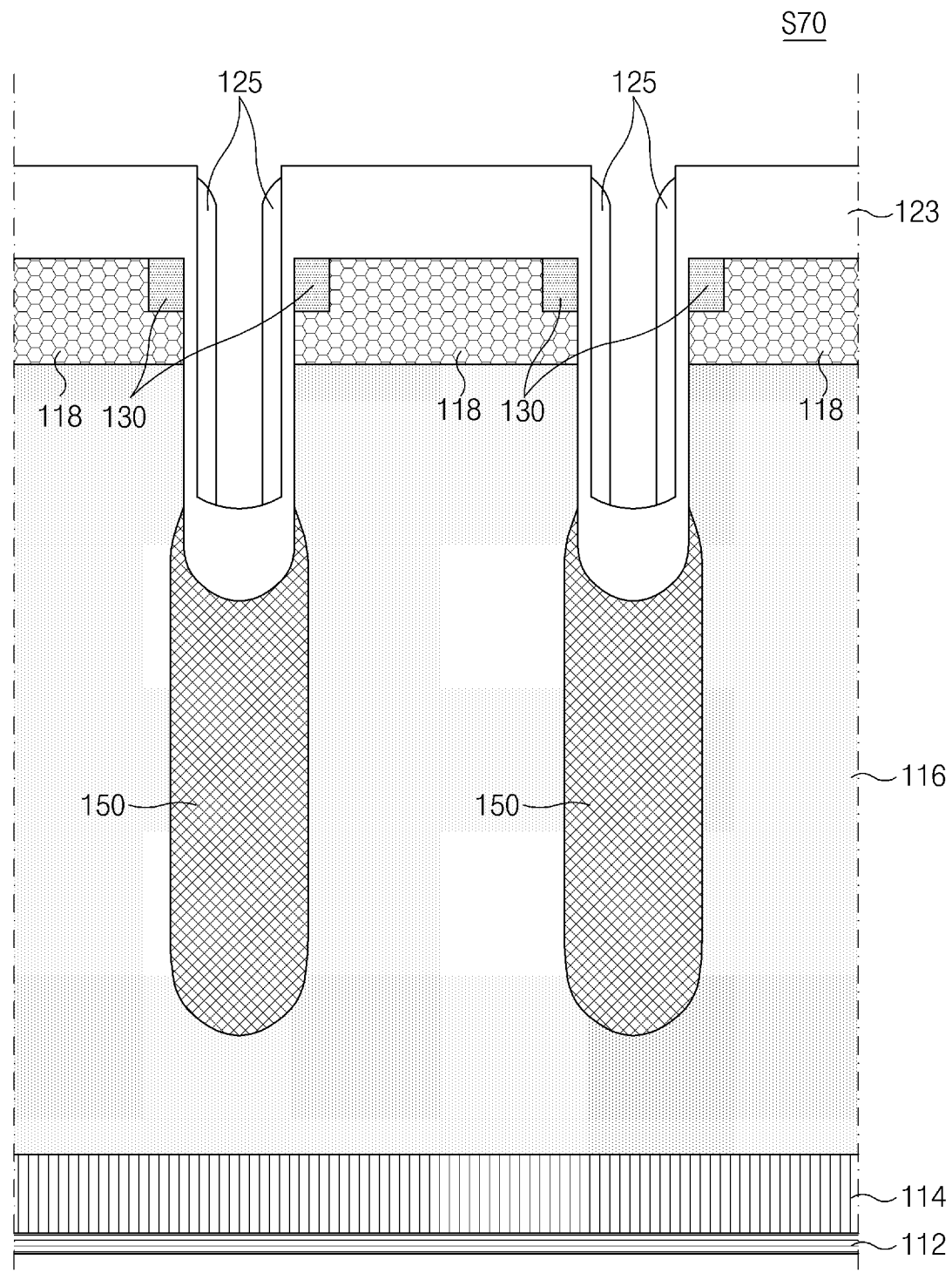
Figure 6H:
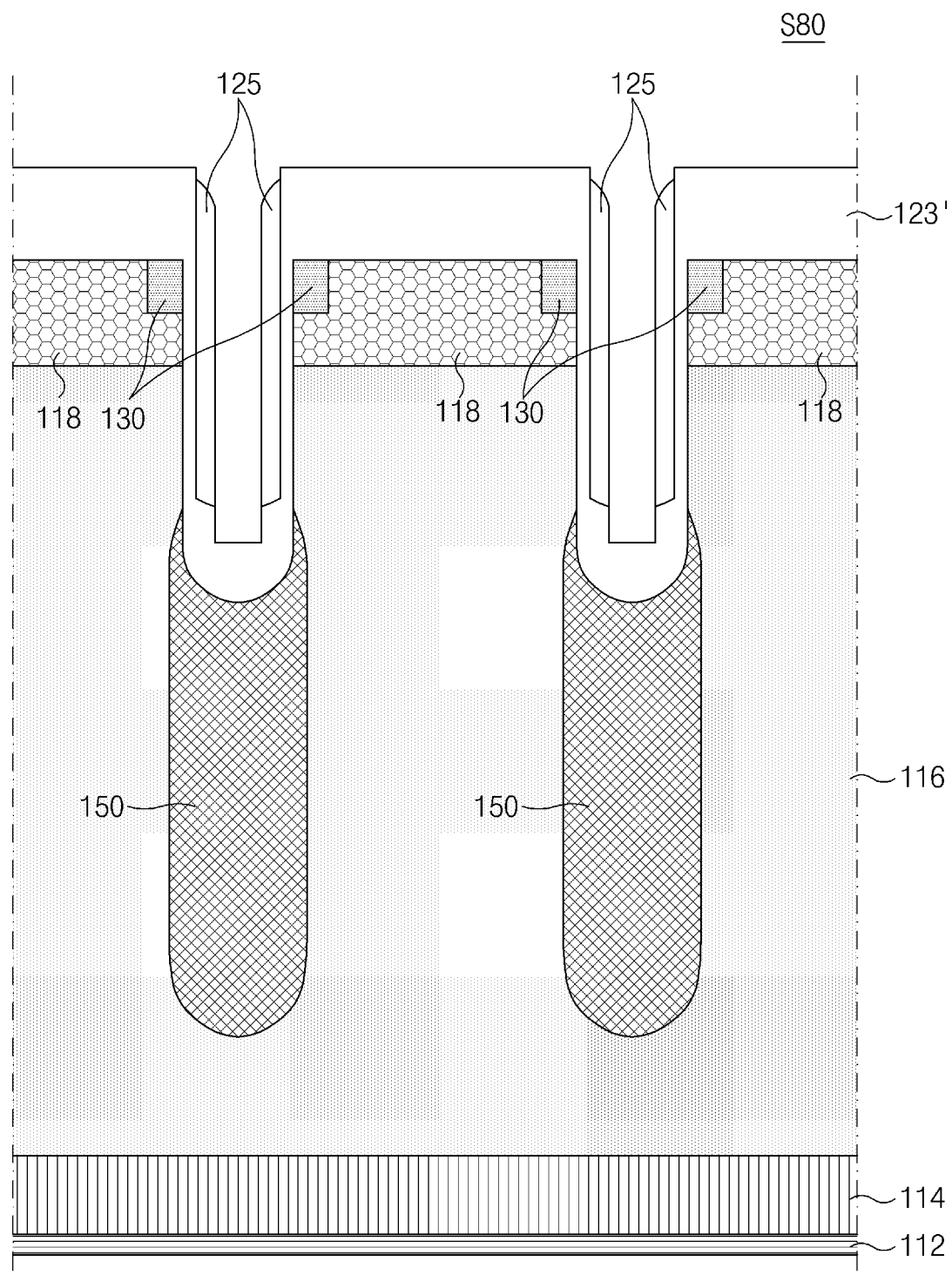
Figure 6I:
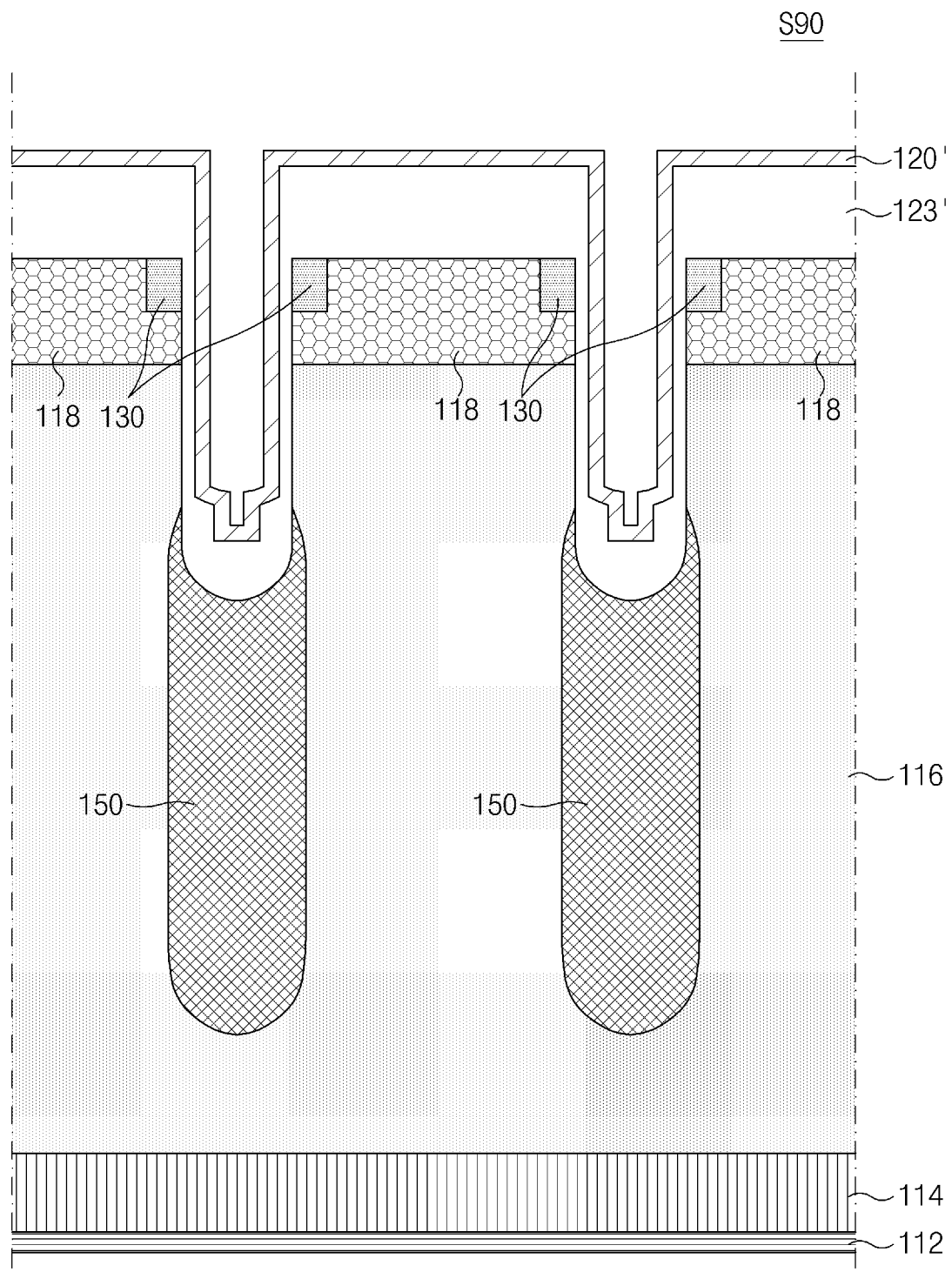
Figure 6J:
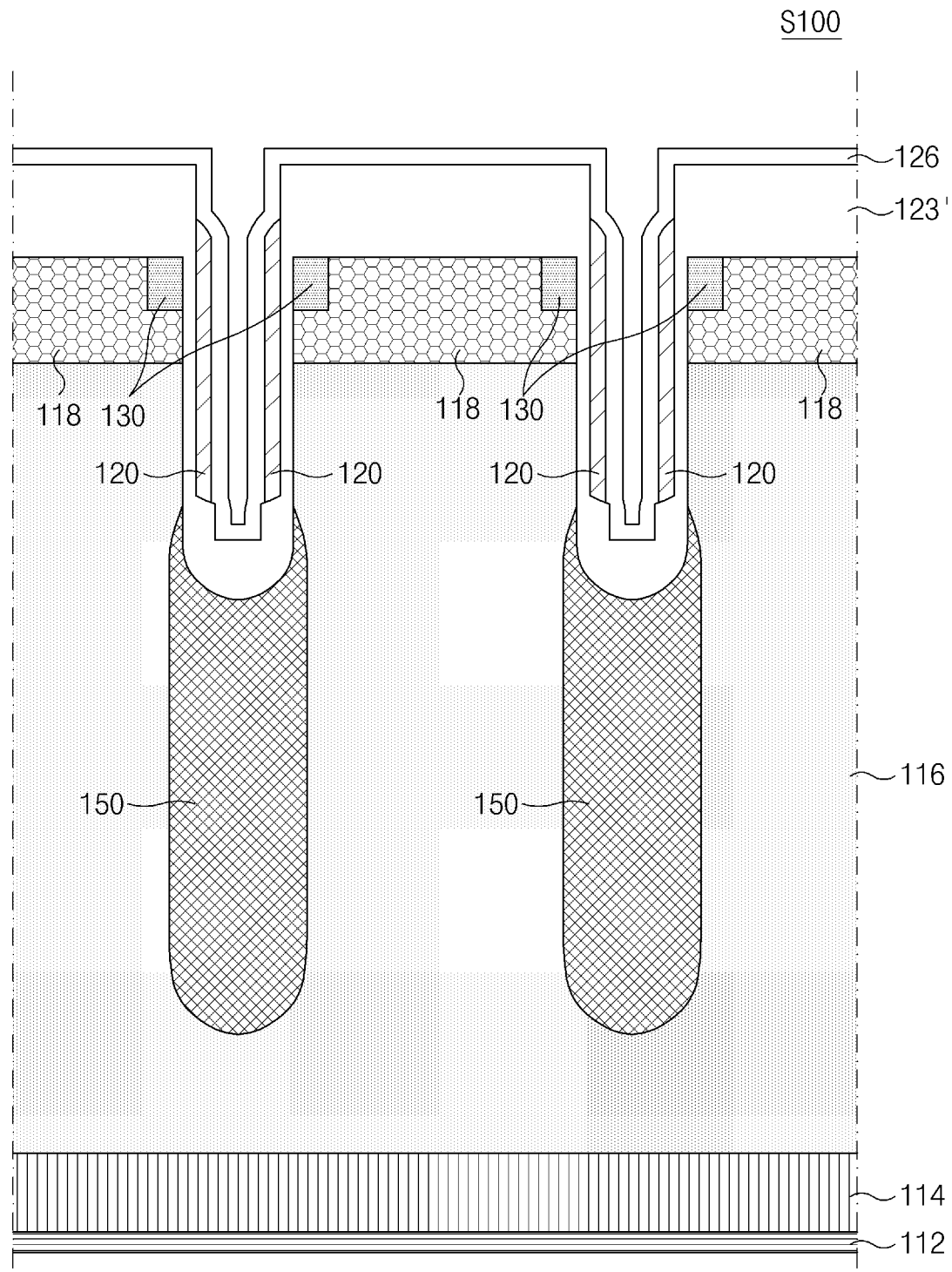
Figure 6K:
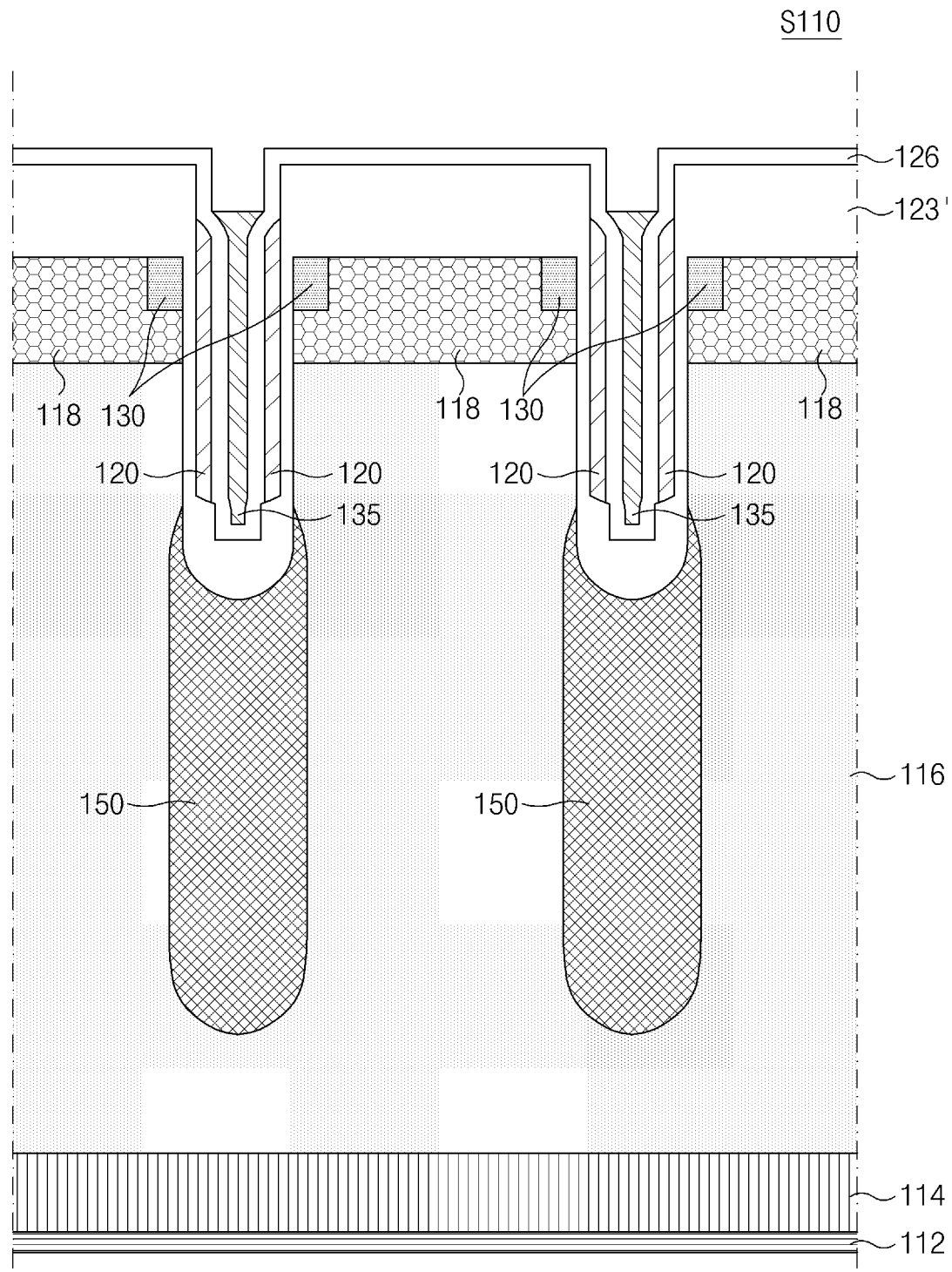
Figure 6L:
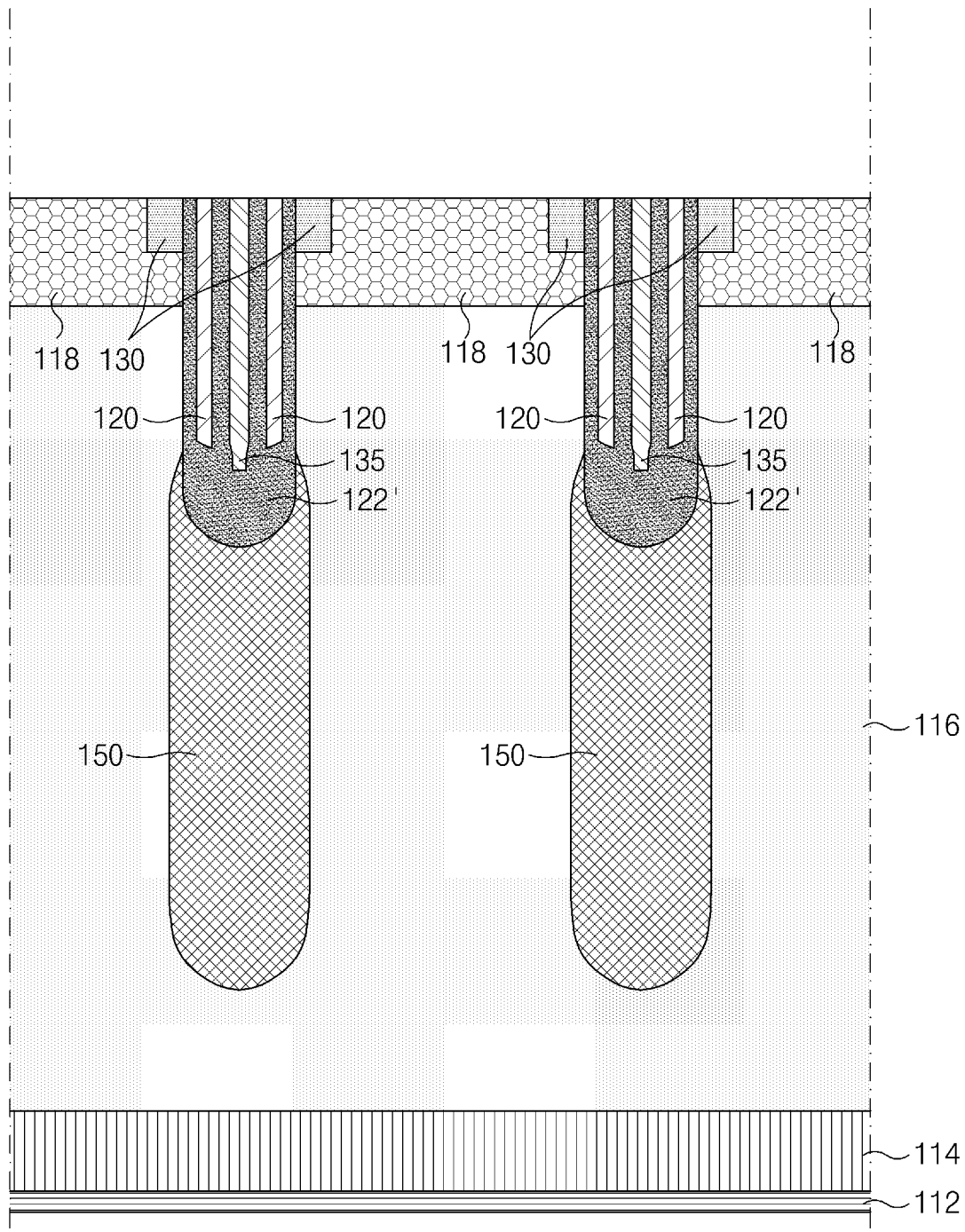
Figure 6M:
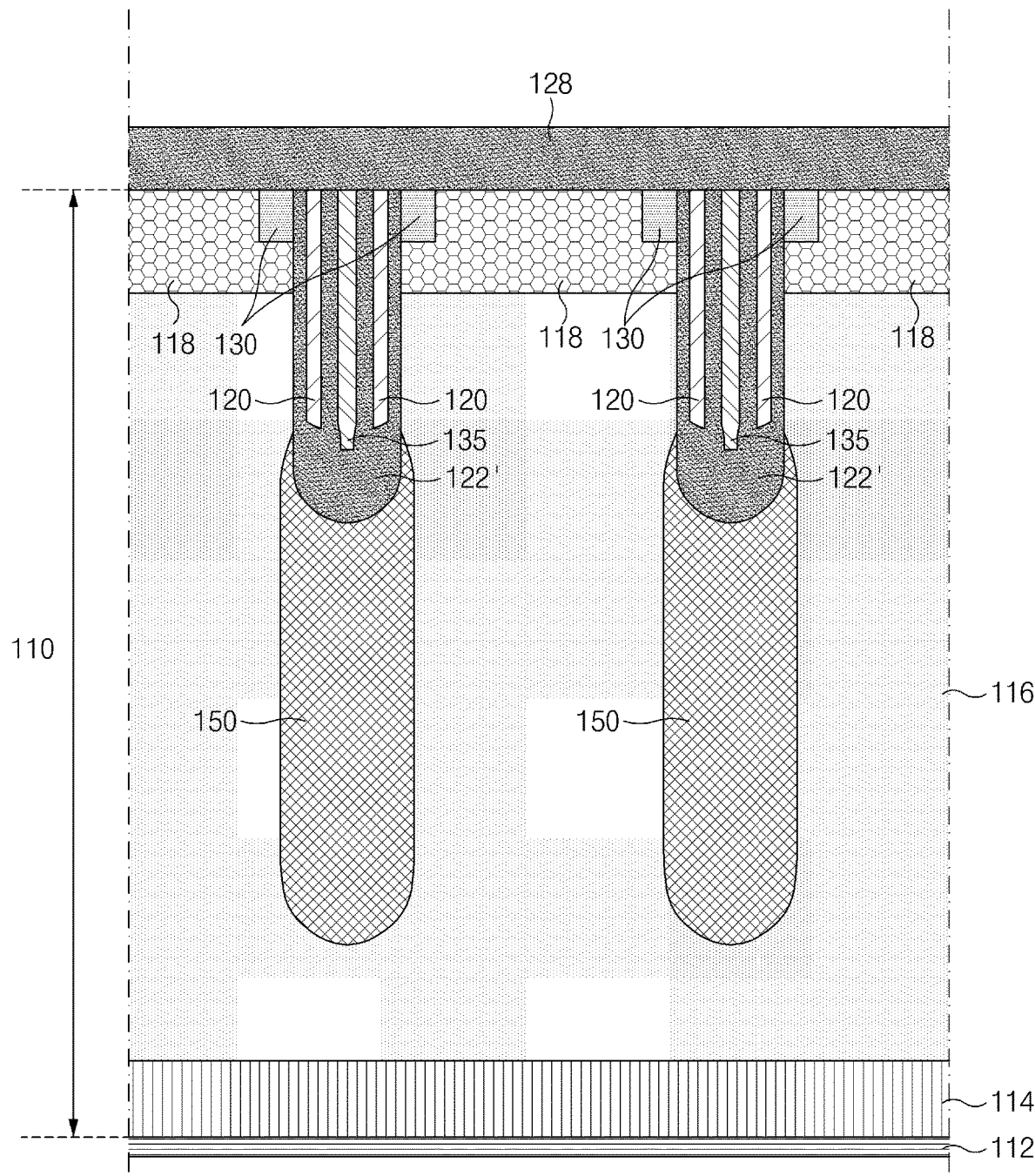
Figure 6N:
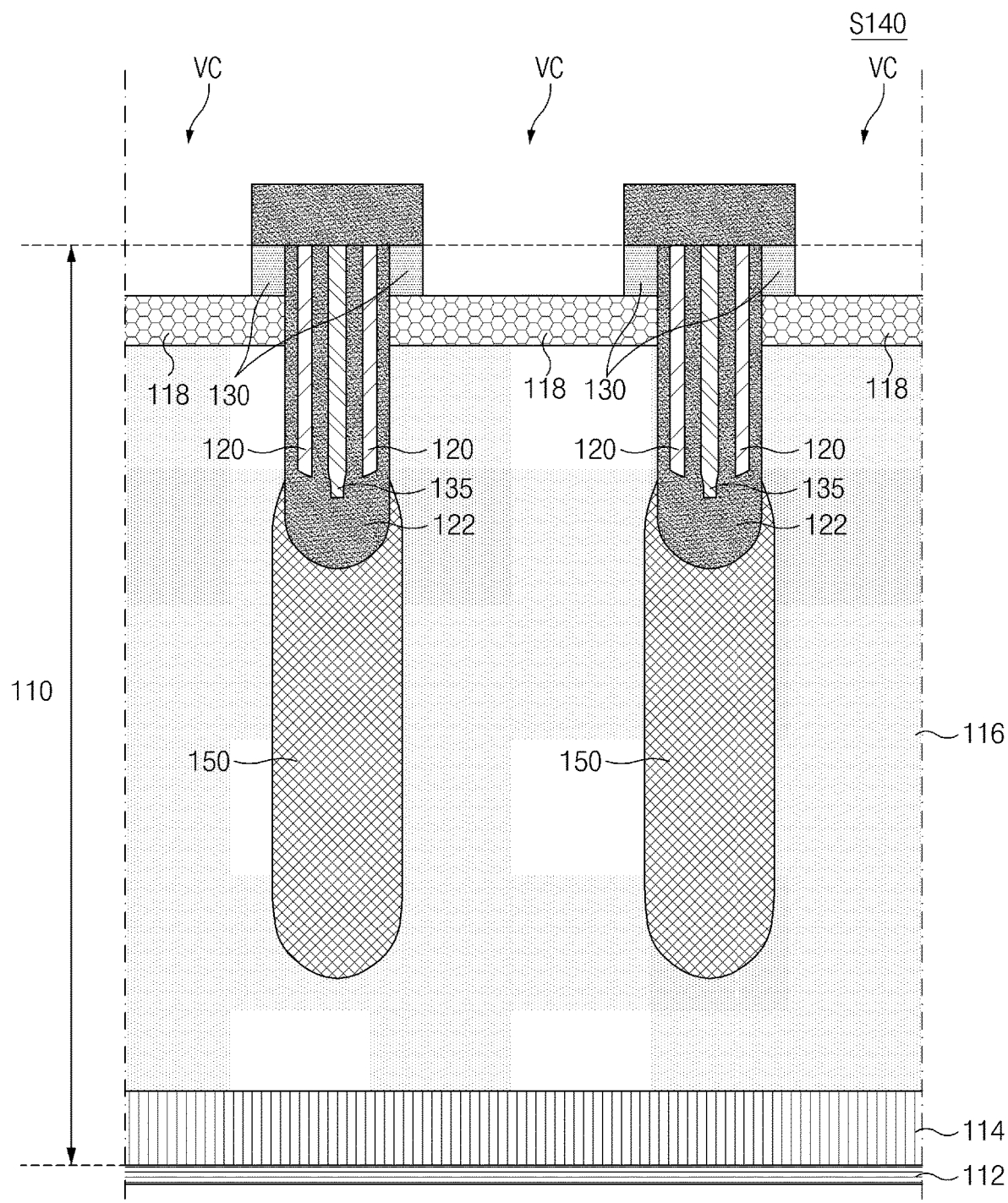
Figure 6O:
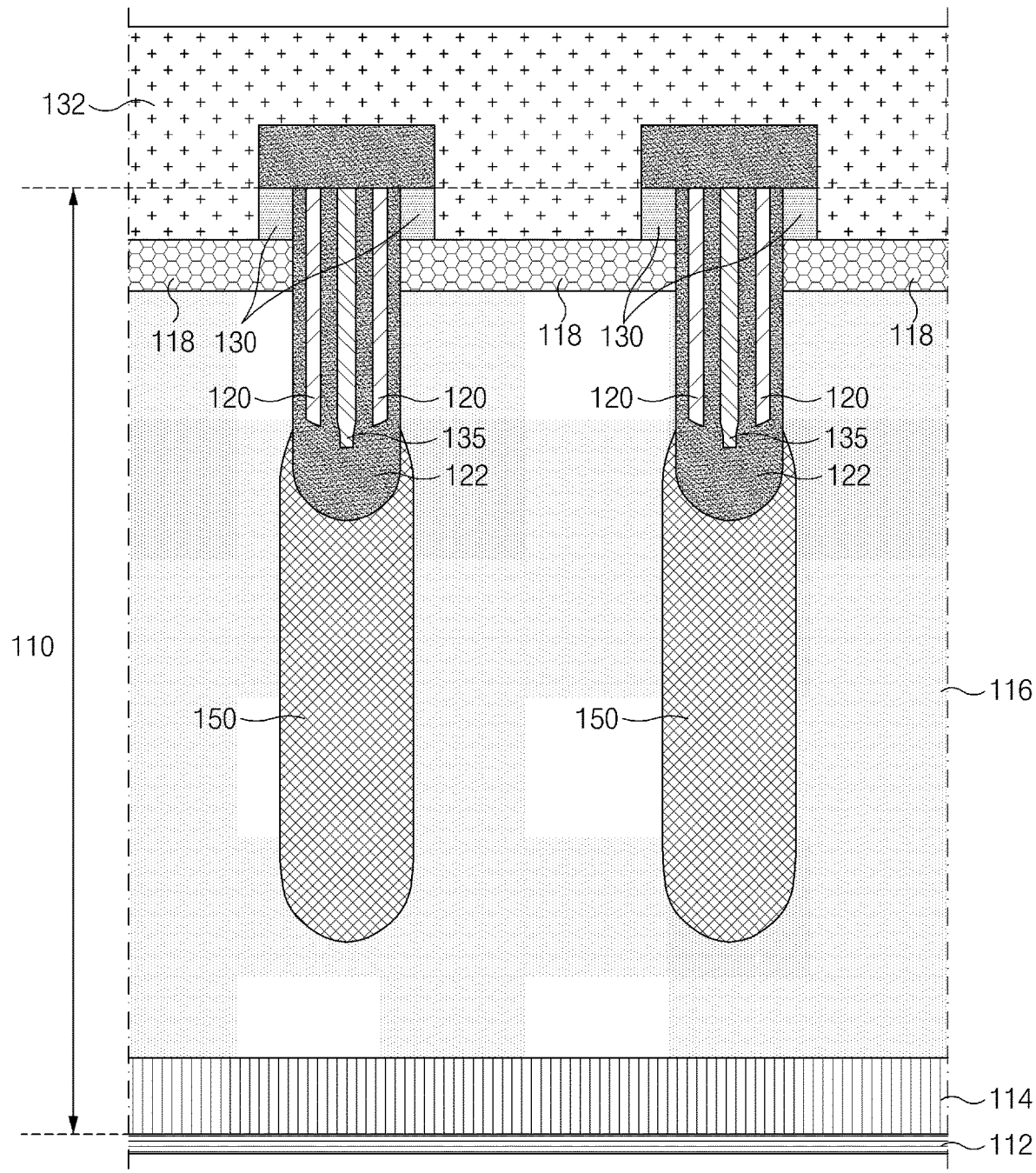

FIGS. 6A to 6O are views illustrating a method for manufacturing a power semiconductor device, according to an embodiment of the present disclosure.

Referring to FIGS. 6A to 6O, a structure in which a drift region 116' is stacked on the collector electrode 112 and the collector region 114 may be provided in S10. In this case, the drift region 116' may have a height lower than that of the drift region 116 illustrated in FIG. 5A. The drift region 116' may be formed through epitaxial growth. According to the present disclosure, although the description of S10 has been made on the assumption that the collector electrode 112 and the collector region 114 are already formed under the drift region 116', at least one of the collector electrode 112 and the collector region 114 may be formed after S10.

In S20, a photoresist pattern defining the floating region 150 may be disposed at an upper portion of the drift region 116', and impurities in the second conductive type may be implanted into the upper portion of the drift region 116' to form the floating region 150. The energy for implanting impurities in the second conductive type may be determined such that the length L of the floating region 150 satisfies a specific capacitance ratio Cge/Cgc.

In S30, the drift region 116 may be formed by adding an epitaxial layer in a first conductive type by performing epitaxial growth with respect to the upper portion (that is, the upper portion of a boundary BD) of the drift region 116'. In other words, the drift region 116 may include a drift region 116' (or the first drift region positioned under the boundary BD) formed before forming the floating region 150, and a drift region (or the second drift region positioned on the boundary BD) formed after forming the floating region 150. According to the present disclosure, the floating region 150 positioned inside the drift region 116 is not formed by performing an etching process, a photoresist process, or a polishing process after first forming the entire portion of the drift region 116, but may be formed at a depth, which may not be made by a general implanting device, by performing an implantation process for the floating region 150 in the middle of the epitaxial growth process for the drift region 116.

In S40, after forming the well region 118 by implanting impurities, which is in the second conductive type, into the entire upper portion of the drift region 116 to form the well region 118, a photoresist pattern for defining the emitter region 130 may be disposed at the upper portion of the drift region 116, and the impurities in the first conductive type is implanted into the upper portion of the drift region 116, thereby forming the emitter region 130.

In S50, an etching mask to define the trench TH may be disposed on the well region 118 and the emitter region 130, and the trench TH may be formed through the well region 118 and the emitter region 130 by performing the etching process. The trench TH may be formed at a position corresponding to the floating region 150 to have a depth for allowing the etching of at least a portion of the floating region 150 and a width W' narrower than the width W of the floating region 150.

In S60, a first surface insulating layer 123 may be formed by isotropic-depositing an insulating material (e.g., a silicon oxide) with respect to the entire portion of the surface of the trench TH, the well region 118, and the emitter region 130.

In S70, after an insulating material (e.g., a silicon nitride) is isotropically deposited inside the trench TH, an anisotropic etching may be performed to form a protective layer 125. The protective film 125 may serve as a mask to protect the first surface insulating layer 123 inside the trench TH and guide an etching position in a subsequent etching process.

In S80, the first surface insulating layer 123 may be etched to a specific depth by employing the protective film 125 as a mask, thereby forming an etched first surface insulating layer 123'. The depth, in which the first surface insulating layer 123' is etched, may be equal to the depth from the lower end of the gate electrode 120 to the lower end of the trench emitter region 135, as illustrated in FIG. 5.

In S90, after removing the protective layer 125, a conductive material (e.g., polysilicon) may be isotropically deposited on the entire portion of the resultant structure to form an electrode layer 120' to be spaced apart from the surface of the trench TH.

In S100, the gate electrode 120 may be formed by anisotropic etching the electrode layer 120', and the second surface insulating layer 126 may be formed by depositing an insulating material (e.g., a silicon oxide) on the entire portion of the resultant structure.

In S110, the conductive material (e.g., polysilicon) is gap-filled inside the trench to form the trench emitter region 135.

In S120, components positioned higher than the upper portion of the emitter region 130 may be removed through a polishing process to planarize the upper portion of the semiconductor substrate 110. Accordingly, the upper portion of each of the emitter region 130, the gate electrode 120, and the trench emitter region 135 may be exposed. According to various embodiments, the emitter region 130 may be formed after planarizing the upper portion of the semiconductor substrate 110 in S120, instead of S40. The first surface insulating layer 123' and the second surface insulating layer 126, in which the polishing process has been finished, may be expressed in the form of one gate insulating film 122'.

In S130, an upper insulating layer 128 may be applied to the upper portion of the semiconductor substrate 110. The upper insulating layer 128 may have the same material as that of the gate insulating film 122 described above.

In S140, an etching mask is disposed on the upper insulating layer 128, and a vacancy VC, which is an empty space, may be formed through the etching process. The position of the etching mask and the etching depth may be determined in advance such that the emitter region 130 may be exposed through the etching process. The emitter region 130 and at least a portion of the well region 118 may be exposed through the etching process. In addition, the gate insulating film 122' and the upper insulating layer 128 which is etched may have the integral form of the gate insulating film 122 illustrated in FIG. 5A.

In S150, as a conductive material is gap-filled in and applied to the upper portion of the gate insulating film 122 and the vacancy VC to form the emitter electrode 132, thereby forming the structure of the power semiconductor device 10 illustrated in FIG. 5A.

According to the power semiconductor device, the power semiconductor chip including the same, and the method for manufacturing the same of an embodiment of the present disclosure, the withstand voltage characteristic may be maintained while the operation stability is improved.

Such an effect is provided only for the illustrative purpose, and embodiments of the present disclosure are not limited thereto.

Various embodiments of the present disclosure do not list all available combinations but are for describing a representative aspect of the present disclosure, and descriptions of various embodiments may be applied independently or may be applied through a combination of two or more.

A number of embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A power semiconductor device, comprising:
   a plurality of gate electrodes configured to be recessed from a first surface of a semiconductor substrate to a second surface of the semiconductor substrate, the second surface being opposite to the first surface;
   an emitter region configured to make contact with a trench and the first surface, wherein the emitter region is provided between respective ones of the plurality of gate electrodes, wherein the emitter region comprises first impurities of a first conductive type;
   a collector region configured to make contact with the second surface, and comprising second impurities of a second conductive type opposite to the first conductive type;
   a floating region extending toward the second surface in an extension direction of the trench while surrounding a bottom surface of the trench, and comprising the second impurities; and
   a trench emitter region interposed between the plurality of gate electrodes in the trench.

2. The power semiconductor device of claim 1, further comprising:
   a gate insulating film interposed between each of the plurality of gate electrodes and the trench emitter region, and between at least one of each of the plurality of gate electrodes and the floating region, and a surface of the trench.

3. The power semiconductor device of claim 2, further comprising a gate insulating film, the gate insulating film being interposed between a side surface of the trench and the plurality of gate electrodes, the gate insulating film having a first thickness that is less than a second thickness of a gate insulating film interposed between the bottom surface of the trench and the plurality of gate electrodes.

4. The power semiconductor device of claim 1, wherein a first length of the trench emitter region extending from the first surface of the semiconductor substrate is longer than a second length of each of the plurality of gate electrodes extending from the first surface.

5. The power semiconductor device of claim 1, wherein the trench emitter region is electrically connected to the emitter region through an emitter electrode.

6. The power semiconductor device of claim 1, wherein the trench emitter region comprises polysilicon.

7. The power semiconductor device of claim 1, wherein a third length of the floating region in the extension direction is greater than a first width of the floating region.

8. The power semiconductor device of claim 1, wherein a first width of the floating region is greater than a second width of the trench.

9. The power semiconductor device of claim 1, wherein a first depth from the first surface to an upper end of the floating region is shallower than a second depth from the first surface to a lower end of the trench.

10. The power semiconductor device of claim 1, wherein a lower end of the floating region is spaced apart from an upper end of the collector region by a specific distance.

11. The power semiconductor device of claim 1, wherein the emitter region comprises a plurality of regions disposed at opposite sides of the trench, respectively.

12. The power semiconductor device of claim 1, further comprising:
a drift region disposed on the collector region, the drift region extending in the extension direction while making contact with a side surface of each of the floating region and the trench, wherein the drift region comprises the first impurities.

13. The power semiconductor device of claim 12, wherein a first doping concentration of the first impurities in the emitter region is heavier than a second doping concentration of the first impurities in the drift region.

14. The power semiconductor device of claim 1, wherein the plurality of gate electrodes are disposed in a stripe type or a ring type, when viewed from a plan view.

15. A power semiconductor chip, comprising:
a cell region including the power semiconductor device of claim 1; and
a peripheral region including a gate terminal, an emitter terminal, and a collector terminal electrically connected to the plurality of gate electrodes, the emitter region, and the collector region, respectively.

16. A method for manufacturing a power semiconductor device, the method comprising:
forming a first drift region comprising first impurities of a first conductive type, through epitaxial growth;
forming a floating region by implanting second impurities comprising a second conductive type opposite to the first conductive type, into an upper portion of the first drift region;
forming a second drift region comprising the first impurities on the first drift region through the epitaxial growth;
forming an emitter region by implanting the first impurities into an upper portion of the second drift region;
forming a trench through the emitter region by performing an etching process to etch at least a portion of the floating region;
forming a plurality of gate electrodes by depositing a conductive material to be spaced apart from a surface of the trench; and
forming a trench emitter region by depositing a conductive material between the plurality of gate electrodes such that the trench emitter region is spaced apart from each of the plurality of gate electrodes.

* * * * *